United States Patent
Tanaka et al.

(10) Patent No.: US 11,693,319 B2
(45) Date of Patent: Jul. 4, 2023

(54) SUBSTRATE PROCESSING METHOD, SUBSTRATE PROCESSING APPARATUS, AND STORAGE MEDIUM

(71) Applicant: Tokyo Electron Limited, Tokyo (JP)

(72) Inventors: Keiichi Tanaka, Kumamoto (JP); Kosuke Yoshihara, Kumamoto (JP); Yoshihiro Kondo, Kumamoto (JP); Makoto Muramatsu, Kumamoto (JP); Teruhiko Kodama, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/496,965

(22) Filed: Oct. 8, 2021

(65) Prior Publication Data
US 2022/0113628 A1    Apr. 14, 2022

(30) Foreign Application Priority Data

Oct. 9, 2020  (JP) .................................. 2020-171403
Jul. 19, 2021  (JP) .................................. 2021-118488

(51) Int. Cl.
G03F 7/16    (2006.01)
G03F 7/20    (2006.01)
G03F 7/00    (2006.01)

(52) U.S. Cl.
CPC ............ *G03F 7/168* (2013.01); *G03F 7/2004* (2013.01); *G03F 7/70058* (2013.01); *G03F 7/70891* (2013.01)

(58) Field of Classification Search
CPC .... G03F 7/168; G03F 7/2004; G03F 7/70058; G03F 7/70891
See application file for complete search history.

(56) References Cited

U.S. PATENT DOCUMENTS

| | | | |
|---|---|---|---|
| 2003/0128348 A1* | 7/2003 | Nishi | G03F 7/70358 355/75 |
| 2003/0215751 A1* | 11/2003 | Otake | G03F 7/423 430/311 |
| 2012/0091097 A1* | 4/2012 | Chen | H01L 21/67213 156/345.28 |
| 2014/0220489 A1* | 8/2014 | Kozuma | G03F 7/40 156/345.29 |

FOREIGN PATENT DOCUMENTS

JP    2013-186191 A    9/2013

* cited by examiner

*Primary Examiner* — Hung V Nguyen
(74) *Attorney, Agent, or Firm* — Nath, Goldberg & Meyer; Jerald L. Meyer; Tanya E. Harkins

(57) ABSTRACT

A method of processing a substrate, includes emitting light including vacuum ultraviolet light to a front surface of the substrate, which has a resist film formed thereon from a resist material for EUV lithography, before an exposure process in an interior of a processing container.

19 Claims, 20 Drawing Sheets

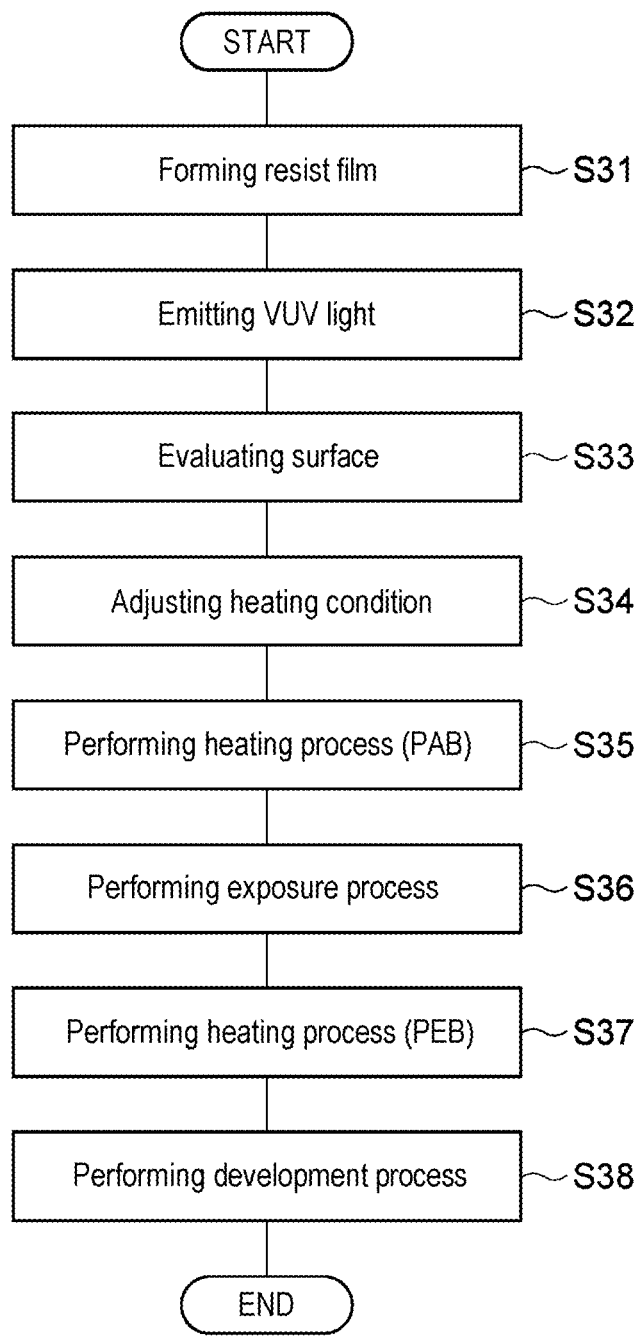

SUBSTRATE PROCESSING METHOD, SUBSTRATE PROCESSING APPARATUS, AND STORAGE MEDIUM

CROSS-REFERENCE TO RELATED APPLICATIONS

This application is based upon and claims the benefit of priority from Japanese Patent Application Nos. 2020-171403 and 2021-118488, filed on Oct. 9, 2020, and Jul. 19, 2021, respectively, the entire contents of which are incorporated herein by reference.

TECHNICAL FIELD

The present disclosure relates to a substrate processing method, a substrate processing apparatus, and a non-transitory computer-readable storage medium.

BACKGROUND

Patent Document 1 discloses an auxiliary exposure apparatus that improves the accuracy or in-plane uniformity of a film pressure or line width of a resist pattern by emitting ultraviolet rays to a resist film formed on a substrate separately from an exposure process.

PRIOR ART DOCUMENT

Patent Document

Patent Document 1: Japanese Laid-Open Patent Publication No. 2013-186191

SUMMARY

According to an aspect of the present disclosure, a method of processing a substrate, includes emitting light including vacuum ultraviolet light to a front surface of the substrate, which has a resist film formed thereon from a resist material for EUV lithography, before an exposure process in an interior of a processing container.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 16 is a view illustrating a modification of the first example of the substrate processing method.

DETAILED DESCRIPTION

Figure 1:
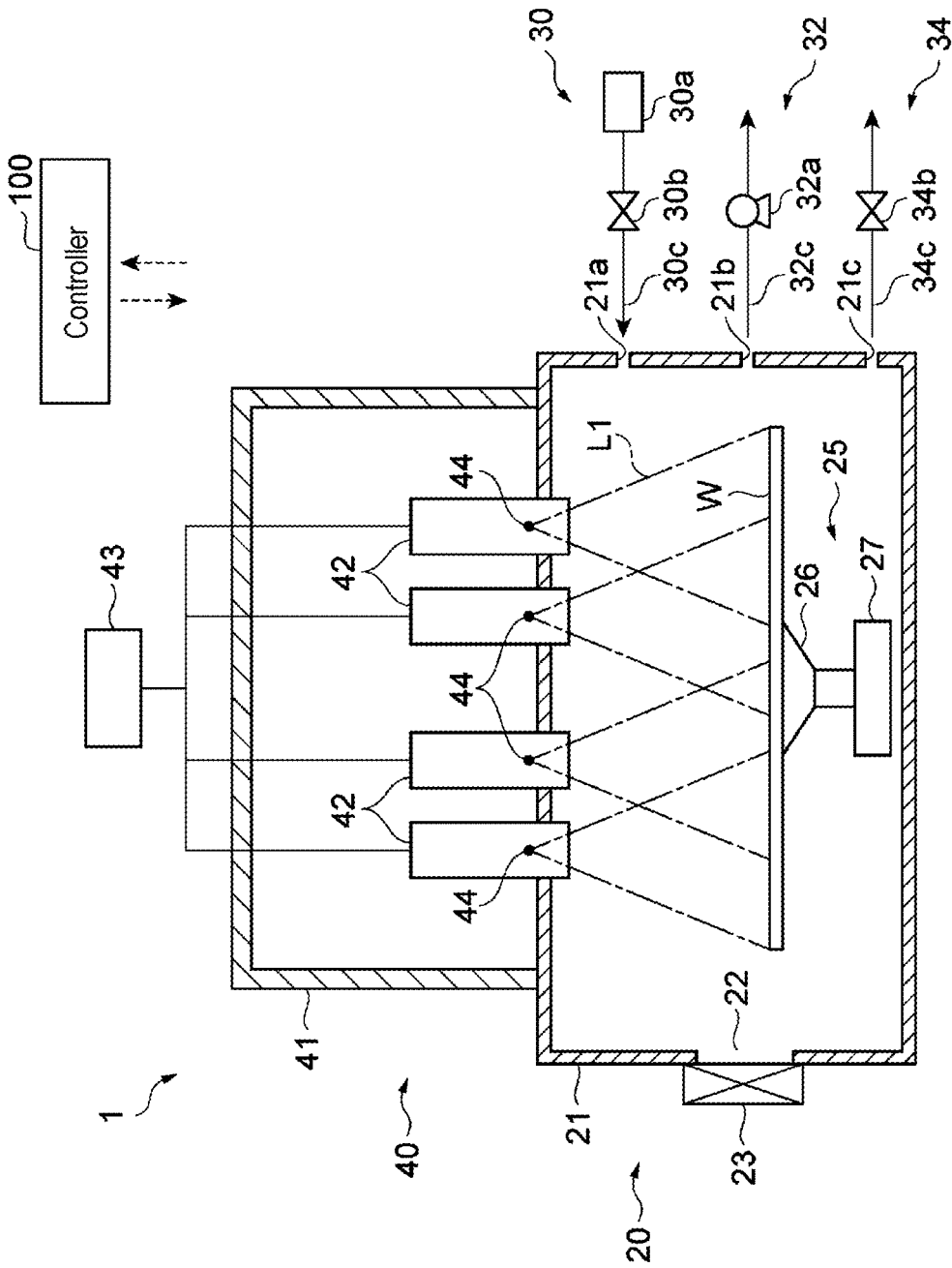
FIG. 1 is a view illustrating a substrate processing apparatus according to an exemplary embodiment.

Hereinafter, various exemplary embodiments will be described. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

In an exemplary embodiment, in a substrate processing method, within a processing container, light including vacuum ultraviolet light is emitted to a front surface of a substrate, which has a resist film formed thereon from a resist material for EUV lithography, before an exposure process.

By emitting the light including the vacuum ultraviolet light to the front surface of the substrate, which has the resist film formed thereon from the resist material for EUV lithography, for example, cleavage of chemical bonds in the resist film occurs, and as a result, sensitivity when exposing the resist film increases.

In an aspect, the light including the vacuum ultraviolet light may be light including consecutive spectrum components of at least a partial band included in a wavelength range of 100 nm to 200 nm. As described above, by emitting, to the resist film, the light including the consecutive spectrum components of at least the partial band included in the wavelength range of 100 nm to 200 nm, sensitivity when exposing the resist film is increased since chemical bonds in the resist film are cleaved at various places.

In an aspect, the amount of the light including the vacuum ultraviolet light per unit area of the front surface of the substrate may be smaller than the amount of light when the light including the vacuum ultraviolet light is emitted after the exposure process. When the light including the vacuum ultraviolet light is emitted before exposure, the light permeates into the resist film and the effect of increasing sensitivity is enhanced even with a smaller amount of light.

In an aspect, light emission may be performed in the state in which the temperature of the substrate is substantially equal to the atmospheric temperature. When the light emission is performed in the state in which the temperature of the substrate is substantially equal to the atmospheric temperature, it is possible to prevent a change in the characteristic of the resist film due to a change in the temperature of the substrate.

In an aspect, the light including the vacuum ultraviolet light may be emitted in the state in which the interior of the processing container is depressurized. By emitting the light including the vacuum ultraviolet light in the state in which the interior of the processing container is depressurized, the permeation of the light including the vacuum ultraviolet light into the resist film is promoted, and the effect of increasing sensitivity is enhanced.

In an aspect, the light including the vacuum ultraviolet light may be emitted in the state in which the interior of the processing container is boosted to a predetermined pressure equal to or lower than the atmospheric pressure after depressurized to a predetermined degree of vacuum. By emitting the light including the vacuum ultraviolet light in the state in which the interior of the processing container is boosted to the predetermined pressure after depressurized to a predetermined degree of vacuum, it is possible to suppress degassing (outgassing) from the front surface of the substrate.

In an aspect, after the emission of the light including the vacuum ultraviolet light, an exposure process may be performed without performing a heating process. With the configuration in which the exposure process is performed without performing the heating process, it is possible to prevent the heating process from being excessively performed on the substrate. At the time of the emission of the light including the vacuum ultraviolet light, in the case in which the interior of the processing container is depressurized to the predetermined degree of vacuum as described above, a liquid component (such as a solvent) inside a resist film may be sufficiently volatilized so that the state of the resist film becomes a dry state in which the exposure process is possible. At this time, the heating process and the transfer of the substrate to a heating process apparatus may be omitted before the substrate is loaded into the processing space in which the exposure process is performed.

In an aspect, after the emission of the light including the vacuum ultraviolet light, the heating process may be performed before the exposure process. With the configuration in which the heating process is performed before the exposure process, it is possible to promote the reaction of the resist film on the substrate and to prevent the exposure from becoming insufficient.

In an aspect, the front surface of the substrate on which the emission of the light including the vacuum ultraviolet light has been performed may be evaluated, and the processing conditions for the substrate may be changed according to the evaluation result. As described above, by changing the processing conditions for the substrate according to the evaluation result of the front surface of the substrate, it is possible to select an appropriate condition in response to, for example, a change in the front surface due to the emission of the light including the vacuum ultraviolet light.

In an aspect, the light including the vacuum ultraviolet light emitted from the light source may be emitted to the front surface of the substrate in a state in which by causing the light to pass through a light adjustment member, a variation in an intensity distribution of light of each wavelength is made to be smaller than that before the transmission. In this case, it is possible to emit, to the substrate, the light including the vacuum ultraviolet light in the state in which by causing the light including vacuum ultraviolet light to pass through the light adjustment member, the variation in the intensity distribution of light of each wavelength is made to be smaller than that before the transmission. As a result, since it is possible to emit the light to the resist film in the state in which the proportions of light of various wavelengths are closer to homogeneity, the effect of increasing sensitivity when exposing the resist film is enhanced.

In another exemplary embodiment, the storage medium is a computer-readable storage medium that stores a program for causing an apparatus to execute the above-described substrate processing method.

In an exemplary embodiment, a substrate processing apparatus includes: a processing container; a light source configured to emit light including vacuum ultraviolet light to a substrate, which has a resist film formed thereon from a resist material for EUV lithography, within the processing container; and a controller configured to control the light source to emit the light including the vacuum ultraviolet light before a exposure process of the substrate.

By emitting the light including the vacuum ultraviolet light emitted from the light source to the front surface of the substrate, which has the resist film formed thereon from the resist material for EUV lithography, for example, cleavage of chemical bonds in the resist film occurs, and as a result, sensitivity when exposing the resist film increases.

In an aspect, the light including the vacuum ultraviolet light may be a light including consecutive spectrum components of at least a partial band included in a wavelength range of 100 nm to 200 nm. As described above, by emitting, to the resist film, the light including consecutive spectrum components of at least a partial band included in the wavelength range of 100 nm to 200 nm, chemical bonds in the resist film are cleaved at various places, and thus sensitivity when exposing the resist film is increased.

In an aspect, the controller may control the light source such that the amount of the light including the vacuum ultraviolet light per unit area of the front surface of the substrate is smaller than the amount of light when the light including the vacuum ultraviolet light is emitted after the exposure process. When the light including the vacuum ultraviolet light is emitted before exposure, the light permeates into the resist film and the effect of increasing sensitivity is enhanced even with a smaller amount of light.

In an aspect, the controller may control the light source to perform the emission of the light in the state in which the temperature of the substrate is substantially equal to the atmospheric temperature. When the emission of the light is performed in the state in which the temperature of the substrate is substantially equal to the atmospheric temperature, it is possible to prevent a change in the characteristic of the resist film due to a change in the temperature of the substrate.

In an aspect, the controller may control the light source to emit the light including the vacuum ultraviolet light in the state in which the interior of the processing container is depressurized. By emitting the light including the vacuum ultraviolet light in the state in which the interior of the processing container is depressurized, the permeation of the light including the vacuum ultraviolet light into the resist film is promoted, and the effect of increasing sensitivity is enhanced.

In an aspect, the substrate processing apparatus may further include a light adjustment member installed on an optical path through which the light including the vacuum ultraviolet light emitted from the light source flows on the substrate, wherein the light adjustment member may emit the light including the vacuum ultraviolet light to the front surface of the substrate in the state in which the light including the vacuum ultraviolet light is incident on the light adjustment member and a variation in an intensity distribution of light of each wavelength is made to be smaller than that before the transmission. In this case, by causing the light including the vacuum ultraviolet light to pass through the light adjustment member, it is possible to emit the light including the vacuum ultraviolet light to the substrate in the state in which the variation in the intensity distribution of light of each wavelength is made to be smaller than that before the transmission. As a result, since it is possible to emit the light to the resist film in the state in which the proportions of light of various wavelengths are closer to homogeneity, the effect of increasing sensitivity when exposing the resist film is enhanced.

In an aspect, in the coating and development apparatus, the substrate processing apparatus may be provided at a position corresponding to a transfer path for the substrate between a resist film forming module and an exposure apparatus within a stacking part in which processing modules are stacked. With this configuration, it is possible to perform processes by the substrate processing apparatus while transferring a substrate in the order of the processes performed on the substrate. Therefore, the processes may be performed by the substrate processing apparatus while preventing the work efficiency in the coating and development apparatus from being lowered.

Hereinafter, various exemplary embodiments will be described in detail with reference to the drawings. In respective drawings, the same or corresponding components will be denoted by the same reference numerals.

[Configuration of Substrate Processing Apparatus]

FIG. 1 is a schematic view (a vertical cross-sectional view) illustrating a substrate processing apparatus according to an embodiment. The substrate processing apparatus 1 emits processing light to a workpiece W. For example, the substrate processing apparatus 1 is configured to emit light including vacuum ultraviolet light (VUV light) to a resist film or a resist pattern formed on the front surface of a workpiece W. Through the emission of the light including the vacuum ultraviolet light by the substrate processing apparatus 1, it is possible to improve sensitivity during the exposure of the resist film. In addition, by emitting the light including the vacuum ultraviolet light, it is possible to achieve an improvement in the surface roughness of the resist pattern obtained through an exposure/development process.

The workpiece W to be processed is, for example, a substrate or a substrate in the state in which a film, a circuit, or the like is formed by implementing a predetermined process thereon. A substrate included in the workpiece W is, for example, a wafer including silicon. The workpiece W (a substrate) has, for example, a disk shape, but may have a shape obtained when a portion of a circular shape is cut out or a shape other than the circular shape, such as a polygonal shape. The workpiece W to be processed may be a glass substrate, a mask substrate, a flat panel display (FPD), or the like, or may be an intermediate body obtained by performing a predetermined process on such a substrate or the like.

The substrate processing apparatus 1 has a function of emitting processing light L1 to the front surface of the workpiece W. As an example, predetermined resist patterns are formed by forming resist films on a silicon-on-carbon (SOC) film on the substrate and a silicon-on-glass (SOG) film on the SOC film, and then performing an exposure/development process. The resist patterns are mask patterns for etching the SOC film and the SOG film, which are lower-layer films, to form patterns in these lower-layer films. The substrate processing apparatus 1 has a function of achieving an improvement in the roughness of the surface of a resist pattern by, for example, emitting the processing light L1 to the front surface of the workpiece W on which the resist pattern is formed. Meanwhile, in the present embodiment, a case in which, after the formation of the resist film, the emission of the processing light L1 is performed by the substrate processing apparatus 1 on the workpiece W before performing the exposure/development process will be described.

In addition, in the substrate processing apparatus 1 according to the present embodiment, a case in which the resist material used for forming a resist pattern is a material suitable for EUV lithography using a EUV laser as an exposure light source will be described. The EUV (extreme ultraviolet) laser is a laser having a wavelength of 13.5 nm. The light including the VUV light is emitted to the workpiece W, which has a resist film formed thereon from a resist material, under a predetermined condition using the substrate processing apparatus 1. As a result, the sensitivity in the subsequent exposure process is improved. In addition, an improvement in the roughness of the surface of the resist is achieved when the resist pattern is formed through the exposure/development process. In addition, it is also possible to achieve an improvement in the surface roughness of the pattern obtained by performing etching using this resist pattern as a mask.

Each part of the substrate processing apparatus 1 will be described. As illustrated in FIG. 1, the substrate processing apparatus 1 includes a processing chamber 20, a light emission mechanism 40 (a light source), and a controller 100.

The processing chamber 20 includes a housing (a processing container) 21, a transfer port 22, a rotary support 25, a gas supplier 30, and a gas discharger 35. The housing 21 is, for example, a portion of a vacuum container provided in an ambient atmosphere and is configured to be capable of accommodating the workpiece W transferred by a transfer mechanism (not illustrated). That is, the housing 21 functions as a processing container for processing the workpiece W therein. In the substrate processing apparatus 1, the workpiece W is processed in the state in which the workpiece W is accommodated in the housing 21. The transfer port 22 is formed in the sidewall of the housing 21. The transfer port 22 is an opening for carrying workpiece W into/out of the housing 21 therethrough. The transfer port 22 is opened and closed by a gate valve 23.

The rotary support 25 has a function of holding the workpiece W while rotating the workpiece W within the housing 21 based on an instruction from the controller 100. The rotary support 25 includes a holder 26 and a rotary drive part 27. The holder 26 supports the central portion of the workpiece W horizontally disposed in the state in which the surface on which the resist pattern 13 is formed is oriented upward, and holds the workpiece W by, for example, vacuum suction. The rotary drive part 27 has a function of rotating the holder 26 holding the workpiece W together with the workpiece W around a vertical axis A1. The rotary drive part 27 is, for example, a rotary actuator powered by an electric motor.

The gas supplier 30 is configured to supply an inert gas (e.g., argon or nitrogen) into the housing 21 through a through-hole 21a formed in the housing 21. The gas supplier 30 includes a gas source 30a, a valve 30b, and a pipe 30c. The gas source 30a stores the inert gas, and functions as an inert gas source. The valve 30b operates on the basis of an operation signal from the controller 100 to open and close the pipe 30c. The pipe 30c connects the gas source 30a, the valve 30b, and the through-hole 21a to each other sequentially from the upstream side.

The gas discharger 32 discharges the gas from the housing 21 through the through-hole 21b formed in the housing 21. The gas discharger 32 includes a vacuum pump 32a and a pipe 32c. The vacuum pump 32a discharges the gas from the interior of the housing 21. The pipe 32c connects the through-hole 21b and the vacuum pump 32a to each other.

The atmosphere adjuster 34 is able to adjust the interior of the housing 21 to an ambient atmosphere through the through-hole 21c formed in the housing 21. The atmosphere adjuster 34 includes a valve 34b and a pipe 34c. The valve 34b operates based on an operation signal from the controller 100 to open and close the pipe 34c. The pipe 34c is able to connect the through-hole 21c to the ambient atmosphere. That is, when the valve 34b is opened, the interior of the housing 21 is adjusted to the ambient atmosphere.

The light emission mechanism 40 includes a housing 41, a light source 42, and a switch 43. The housing 41 is provided on the housing 21. A plurality of light sources 42 are accommodated in the housing 41. Lamps 44 are provided inside the light sources 42, respectively, and light is emitted downward from the light sources 42 by the light emission of the lamps 44. The lower end surfaces of the light sources 42 may be provided within, for example, the housing 21.

Figure 2:
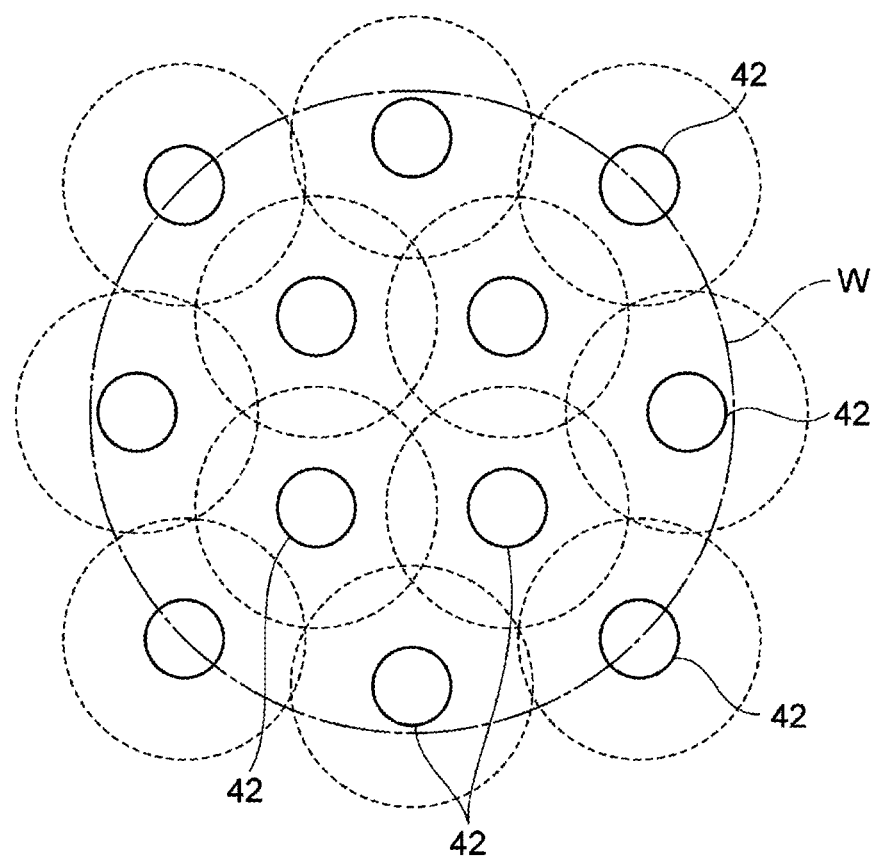
FIG. 2 is a schematic view exemplifying an arrangement of light sources in the substrate processing apparatus.
Figure 3:
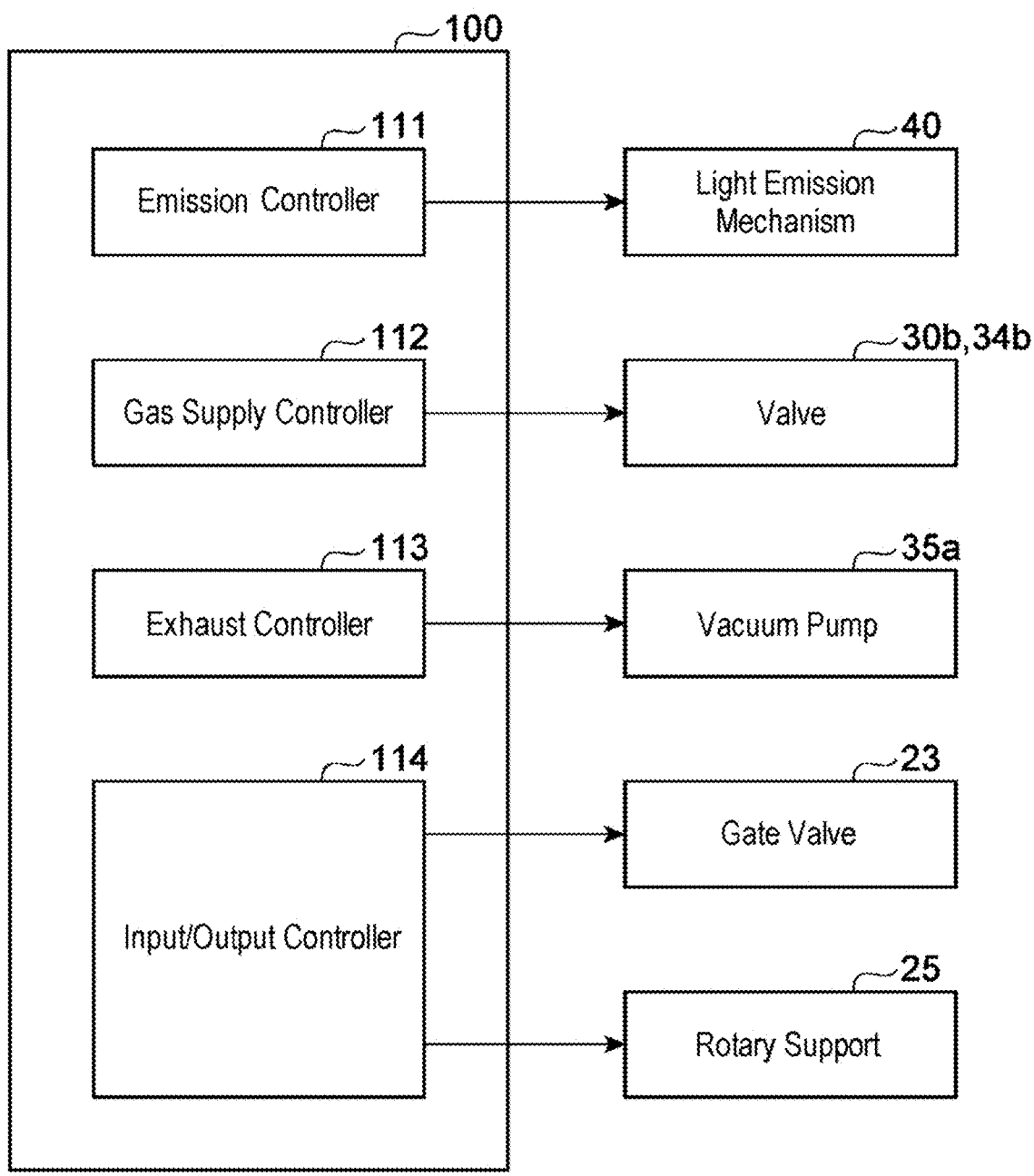
FIG. 3 is a block diagram exemplifying a functional configuration of a controller.

FIG. 2 is a plan view illustrating an exemplary arrangement of the light sources 42. The light sources 42 are arranged along two concentric circles centering on an axis A1 that is the rotation axis of the holder 26 in a plan view. Specifically, four light sources 42 and eight light sources 42 are arranged along the inner circle and the outer circle, respectively, at intervals in the circumferential direction. The light sources 42 arranged in this way emit light to the entire front surface of the workpiece W held by the holder 26. The switch 43 switches ON/OFF of lighting of the light sources 42. The operation of the switch 43 is controlled by the controller 100. The exemplary arrangement of the light sources 42 is an example, and may be appropriately changed.

The lamps 44 inside the light sources 42 emit light including light in a wavelength range of, for example, 115 nm to 400 nm. As an example, the light sources 42 emit light forming a consecutive spectrum of 115 nm to 400 nm. The "light forming a consecutive spectrum" may include light including consecutive spectrum components of at least a partial band (e.g., a wavelength width of 10 nm or more) included in a wavelength range of 100 nm to 200 nm (corresponding to the wavelength range of vacuum ultraviolet light (VUV light)).

In addition, the "consecutive spectrum" refers to a spectrum that consecutively spreads in a specific wavelength range (in the present embodiment, a wavelength width of 10 nm or more), and is a spectrum that is distinguished from a line spectrum (a bright line spectrum) at a specific wavelength. As the light forming a consecutive spectrum including a portion of the wavelength range of 100 nm to 200 nm, the light forming the consecutive spectrum in the above-described wavelength range of 115 nm to 400 nm may be used. The light emitted from the light sources 42 does not have to be "light forming a consecutive spectrum" in the entire wavelength range, but is considered to be light forming a consecutive spectrum in at least a partial range. As an example, since the light emitted from the light sources 42 forms a consecutive spectrum in a wavelength range overlapping the wavelength range of 100 nm to 200 nm (corresponding to the wavelength range of vacuum ultraviolet light (VUV light)), the action of the light emitted from the light sources 42 to be described later will be effectively exerted.

Vacuum ultraviolet light (VUV light) is generally considered to be light having a wavelength range of 10 nm to 200 nm. However, when the light emitted from the light sources 42 is the VUV light on the long wavelength side of 100 nm or more, the effect of processing by the substrate processing apparatus 1, that is, the effect of modifying a resist film can be further enhanced. Since the light on the short wavelength side (light having a wavelength shorter than 100 nm) is not likely to enter the inside of the resist film, it may be difficult to exert the effect of modifying the entire resist film.

The main wavelength range of the light emitted from the light sources 42 may be different from the wavelength of the light used for, for example, exposure of a resist film. The light having a wavelength used for exposure, for example, the extreme ultraviolet (EUV) laser, is a laser having a wavelength of 13.5 nm. When the light having the wavelength used for the exposure of a resist film, that is, the EUV light, is used in the substrate processing apparatus 1, there is a possibility that an exposure process for the workpiece W proceeds at a processing timing by the substrate processing apparatus 1. Therefore, it is considered that the effect of light having a wavelength different from the exposure by EUV light is obtained by setting the main wavelength range of the light emitted from the light sources 42 to 100 nm or more.

In addition, the light emitted from the light sources 42 may include near-ultraviolet light (near-ultraviolet rays) having a wavelength longer than that of VUV light, in addition to the VUV light. As an example, the light from the light sources 42 may be configured to include light in a band having a wavelength of 160 nm or less. As described above, the light emitted from the light sources 42 includes at least light in the wavelength range defined as VUV light. Therefore, the light emitted from the light sources 42 may be referred to as "light including VUV light".

The lamps 44 provided in the light sources 42 are, for example, deuterium lamps, and may be configured to emit VUV light having a wavelength of 200 nm or less. The wavelength of the peak of the consecutive spectrum may be, for example, 160 nm or less, or 150 nm or more. In addition, since the peak wavelength of the light from the light sources 42 is 248 nm or less in the spectrum, the effect of the light in the wavelength range of the VUV light included in the light from the light sources 42 is enhanced. The light from the light sources 42 may be light forming a consecutive spectrum having a plurality of sub-peaks. The sub-peaks may be 248 nm or less, for example, 160 nm or less. The light from the light sources 42 is not limited to the consecutive spectrum, and includes, for example, light having one or more wavelengths in the wavelength range of 115 nm to 400 nm. The expression "including light in a specific wavelength range" means including light having one or more wavelengths included in the wavelength range.

Since the wavelength range of the spectrum of the light emitted from the light sources 42 is relatively wide, the resist film on the workpiece W receives the energy of light having various wavelengths. As a result, various reactions occur on the surface of the resist film. Specifically, the sensitivity of the resist film to exposure is enhanced since the chemical bonds are cleaved at various positions in the molecule constituting the resist film. Therefore, the exposure is appropriately performed even with a smaller exposure amount. In addition, since various compounds are generated by the above-mentioned cleavage of chemical bonds, the orientation of the molecules existing in the resist film before the light emission is eliminated. As a result, surface free energy in the resist film is reduced, and internal stress is reduced. That is, by using the light sources 42 as a light source, the fluidity of the surface of the resist film is likely to be high, and as a result, it is possible to improve the roughness improvement effect with respect to the surface when the resist pattern was formed.

Figure 4:
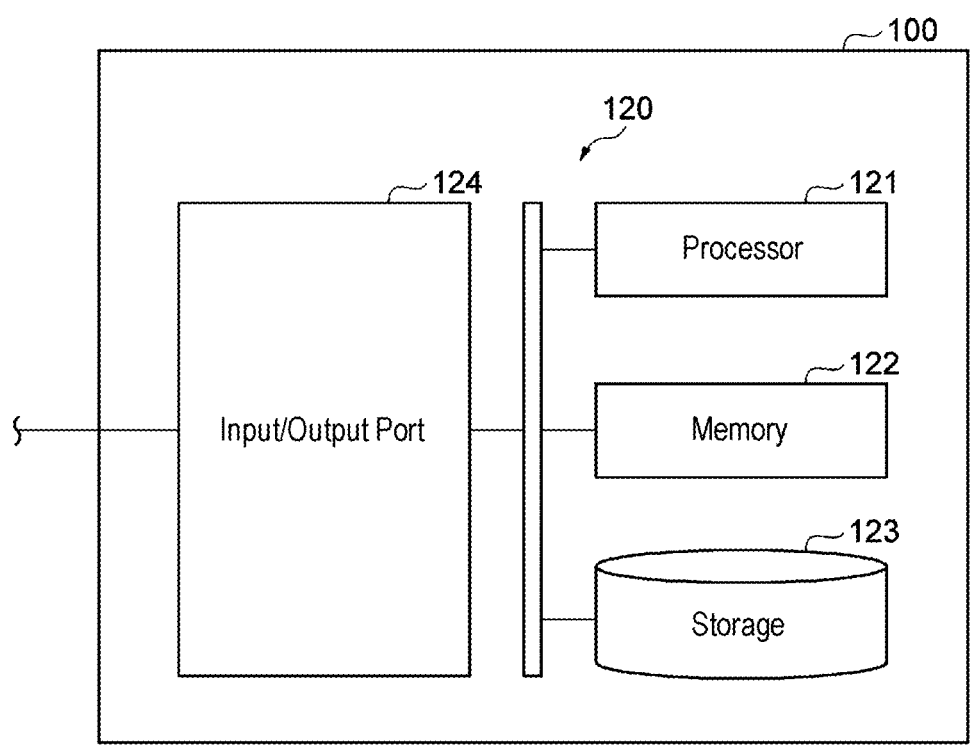
FIG. 4 is a block diagram exemplifying a hardware configuration of the controller.

The controller 100 of the substrate processing apparatus 1 controls the rotary support 25, the gas supplier 30, the gas discharger 35, and the light emission mechanism 40. As exemplified in FIG. 4, the controller 100 includes, as functional components (hereinafter, referred to as "functional modules"), an emission controller 111, a gas supply controller 112, an exhaust controller 113, and an input/output controller 114. These functional modules merely correspond to the functions of the controller 100 divided into a plurality of modules for convenience, which does not necessarily mean that the hardware constituting the controller 100 is divided into such modules.

The emission controller 111 controls the light emission mechanism 40 to emit light including VUV light at a desired timing. For example, the emission controller 111 controls the light emission mechanism 40 to turn on all the light sources 42 before the emission timing. In addition, the emission controller 111 controls the light emission mechanism 40 to turn off all the light sources 42 after the emission timing is completed.

The gas supply controller 112 controls the valve 30b to supply an inert gas from the through-hole 21a into the housing 21. The exhaust controller 113 controls the vacuum pump 35a to exhaust the gas within the housing 21 to the outside through the through-hole 21b.

The input/output controller 114 controls the gate valve 23 to open/close the transfer port 22 depending on carry-in of the workpiece W into the housing 21/carry-out of the workpiece W from the housing 21, and controls the rotary support 25 to switch between holding and releasing of the workpiece W by the holder 26.

The controller 100 is constituted with one or more control computers. For example, the controller 100 includes a circuit 120 illustrated in FIG. 4. The circuit 120 includes one or more processors 121, a memory 122, a storage 123, and an input/output port 124. The storage 123 has a non-transitory computer-readable storage medium such as a hard disk. The storage medium stores a program for causing the substrate processing apparatus 1 to execute a substrate processing procedure to be described later. The storage medium may be a removable medium, such as a nonvolatile semiconductor memory, a magnetic disk, or an optical disk. The memory 122 temporarily stores programs loaded from the storage medium of the storage 123 and the results of an arithmetic operation performed by the processors 121. The processors 121 constitute the above-described respective functional modules by executing the programs in cooperation with the memory 122. The input/output port 124 inputs and outputs an electric signal between respective parts controlled by the controller in response to a command from the processor 121.

The hardware configuration of the controller 100 is not necessarily limited to constituting each functional module by a program. For example, each functional module of the controller 100 may be constituted by a dedicated logic circuit or an application specific integrated circuit (ASIC) in which the dedicated logic circuit is integrated.

[Arrangement of Substrate Processing Apparatus]

Figure 5:
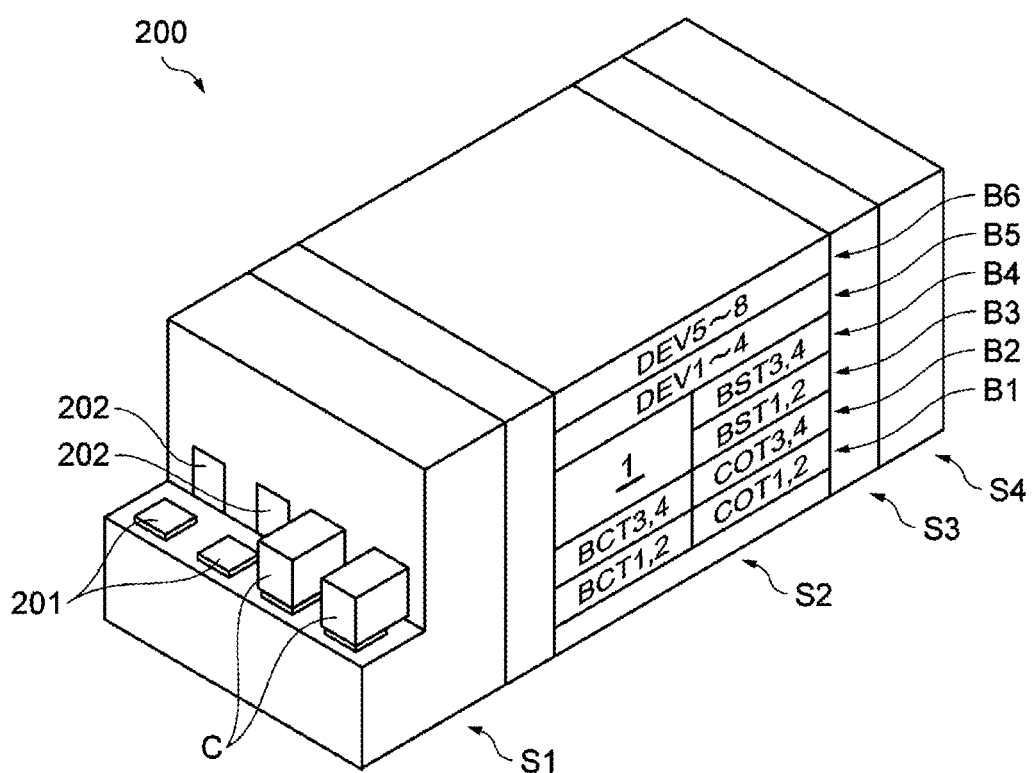
FIG. 5 is a perspective view illustrating an exemplary arrangement of a substrate processing apparatus in a coating and development apparatus.
Figure 6:
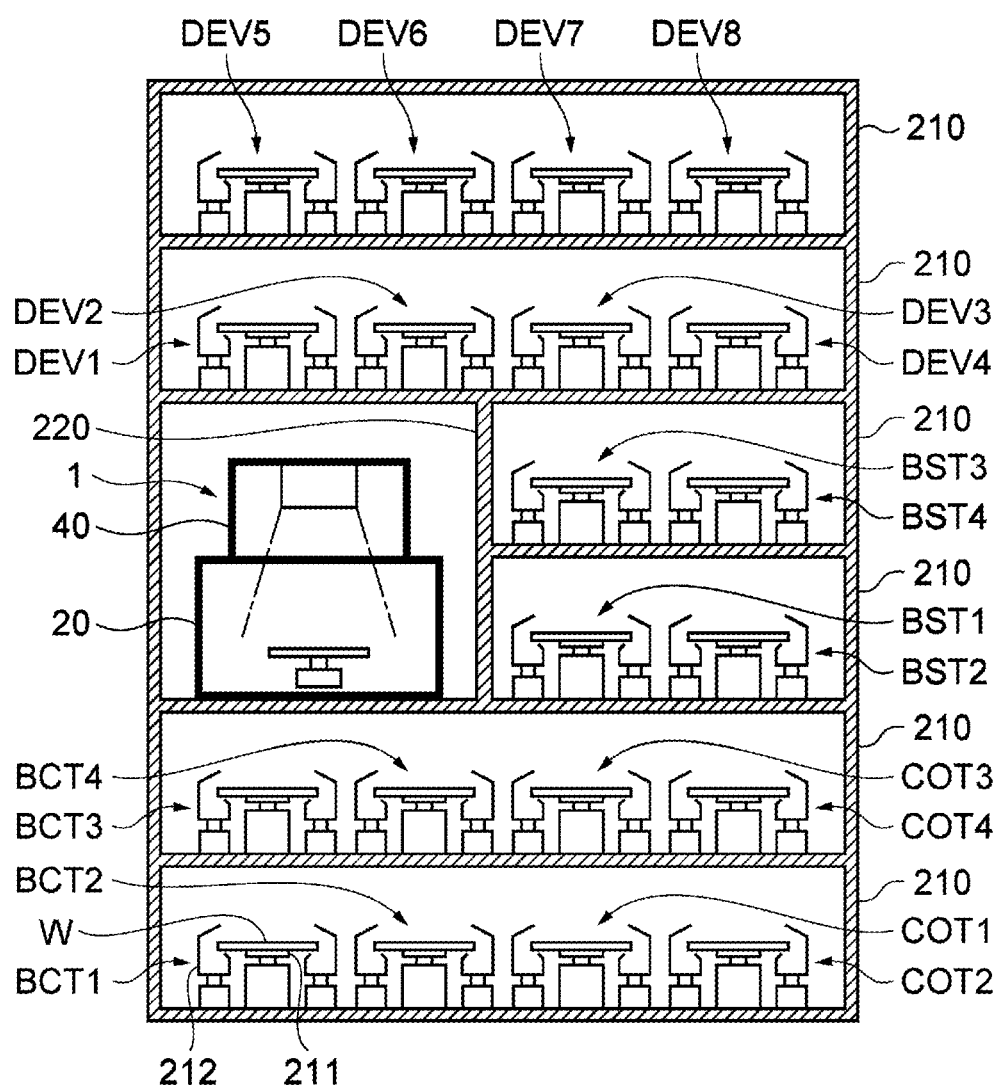
FIG. 6 is a vertical cross-sectional view illustrating an exemplary arrangement of the substrate processing apparatus in the coating and development apparatus.

An exemplary arrangement of the above-described substrate processing apparatus 1 will be described with reference to FIGS. 5 and 6. FIG. 5 is an exemplary schematic perspective view of a coating and development apparatus 200 equipped with the substrate processing apparatus 1. The coating and development apparatus 200 includes a carrier block S1 for carry-in/out of carriers C in each of which, for example, 25 workpieces W are accommodated in a hermetically sealed manner, a processing block S2 for processing the workpieces W, an interface block S3, wherein the blocks are linearly arranged. An exposure apparatus S4 configured to perform a liquid immersion exposure may be connected to the interface block S3. The coating and development apparatus 200 may function as a substrate processing system connected to the exposure apparatus S4.

The carrier block S1 is provided with, for example, stages 201 on each of which a carrier C is placed, and opening/closing parts 202 provided in the wall surface in front of the stages 201, respectively. Inside the carrier block S1, a delivery arm configured to take out workpieces W from each carrier C through the corresponding opening/closing part 202 is provided so that the workpieces W are collectively delivered to a delivery module. Places in which the workpieces W can be placed will be referred to as modules, and among these modules, the modules configured to perform processes, such as heating, liquid processing, gas supply, and peripheral edge exposure, on the workpieces W will be referred to as processing modules. In addition, among the processing modules, a module configured to supply a chemical liquid or a cleaning liquid to the workpieces W will be referred to as a liquid processing module.

The processing block S2 connected to the carrier block S1 is constituted by stacking first to sixth unit blocks B1 to B6 configured to perform respective liquid processes on the workpieces W, in order from the bottom. FIG. 6 illustrates an exemplary schematic vertical cross-sectional view of the processing block S2. The first unit block B1 and the second unit block B2 are constituted similar to each other, and are configured to form an antireflective film and a resist film on each of the workpieces W.

The third unit block B3 and the fourth unit block B4 are provided with modules configured to form a protective film for the liquid immersion exposure and to clean the rear surface side of each of the workpieces W. In addition, the fifth unit block B5 and the sixth unit block B6 are provided with modules configured to perform a development process on the workpieces W after the liquid immersion exposure. In this way, unit blocks, which perform the same process on the workpieces W, are provided in two layers. Among these unit blocks, the substrate processing apparatus 1 is provided to extend across the unit blocks B3 and B4 in the vertical direction.

Each of the unit blocks B1 to B6 is provided with a liquid processing module, a heating module, a main arm as transfer means for the corresponding unit block, and a transfer region in which the main arm moves. In each of the unit blocks B1 to B6, the workpieces W are transferred independently of each other by the main arms A, and a process is performed.

The transfer region is a linear transfer path extending from the carrier block S1 to the interface block S3 in the centers of the unit blocks B1 to B6. Processing units 210 illustrated in FIG. 6 are provided on the right side when the transfer region is viewed from the carrier block S1 toward the interface block S3. The processing units 210 are provided in the unit blocks B1 to B6, respectively. The processing units 210 of the respective unit blocks B1 to B6 form a stacking part in which the processing modules are stacked and arranged.

Specifically, the processing unit 210 of the unit block B1 is provided with antireflective film forming modules BCT1 and BCT2, and resist film forming modules COT1 and COT2. Each of the antireflective film forming modules BCT and the resist film forming modules COT includes a spin chuck 211 configured to suction and hold the central portion of the rear surface of the workpiece W and to be rotatable. In addition, a processing cup 212 configured to suppress the scattering of a chemical liquid is provided to surround the spin chuck 211. In addition, the antireflective film forming modules BCT1 and BCT2 may be provided with a nozzle shared by these modules to supply a chemical liquid for forming an antireflective film. The resist film forming modules COT1 and COT2 may be constituted similar to the antireflective film forming modules BCT1 and BCT2, except that the processing liquid supplied from the nozzle is a resist liquid.

The processing unit 210 of the second unit block B2 is constituted similar to the first unit block B1 described above and is provided with antireflective film forming modules BCT3 and BCT4, and resist film forming modules COT3 and COT4.

In addition, in the third unit block B3, the substrate processing apparatus 1 is provided instead of the antireflective film forming modules BCT1 and BCT2 in the first unit block B1. In addition, the rear surface cleaning modules BST1 and BST2 are provided instead of the resist film forming modules COT1 and COT2. Instead of being provided with a nozzle configured to supply a chemical liquid to the front surface of the workpiece W, the rear surface cleaning modules BST1 and BST2 are each provided with a nozzle configured to supply a cleaning liquid to the rear surface and the bevel portion at the peripheral edge of the workpiece W to clean the rear surface of the workpiece W. Except for such a difference, each of the rear surface cleaning modules has a configuration similar to that of the antireflective film forming modules BCT. In addition, the fourth unit block B4 is constituted similar to the third unit block B3 described above and is provided with the substrate processing apparatus 1 and the rear surface cleaning modules BST3 and BST4.

The fifth unit block B5 has a configuration substantially similar to that of the unit block B1, except that development modules DEV1 to DEV4 are provided instead of the antireflective film forming modules BCT and the resist film forming modules COT. The development modules DEV are constituted similar to the resist film forming modules COT, except that the development modules DEV supply a developer to the workpiece W instead of a resist. The sixth unit block B6 is constituted similar to the unit block B5 and is provided with development modules DEV5 to DEV8.

The substrate processing apparatus 1 is provided to permeate the third unit block B3 and the fourth unit block B4 in the vertical direction. A space A1 is provided to connect the third unit block B3 and the fourth unit block B4 to each other, and the processing chamber 20 and the light emission mechanism 40 of the substrate processing apparatus 1 are provided in the space A1. The transfer port 22 in the substrate processing apparatus 1 is provided on the central transfer region side. In addition, in the third unit block B3 and the fourth unit block B4, a partition wall 220 may be provided between the space A1 in which the substrate processing apparatus 1 is arranged and the space in which the rear surface cleaning modules BST1 to 4 to partition both of the spaces.

The reason why the substrate processing apparatus 1 is arranged to extend across two unit blocks in the vertical direction in which different modules are set in two stages is to secure a sufficient distance between the workpiece W and the light sources 42. As described above, the substrate processing apparatus 1 is provided with the light sources 42 configured to emit the light including the VUV light to the workpiece W with light including VUV light. At this time, when the distance between the light sources 42 and the workpiece W is short, the heat from the light sources 42 may propagate to the workpiece W and the temperature of the workpiece W may rise. The temperature change of the workpiece W may affect a process on the workpiece W. Therefore, as described above, in order to secure the distance between the workpiece W and the light sources 42, a larger space (two unit blocks in the vertical direction) is secured in the vertical direction (the height direction) compared to the other modules. When trying to reduce the distance between the light source 42 and the workpiece W by weakening the amount of the VUV light from the light sources 42 to such an extent that the temperature does not affect the workpiece W, there is also a risk that the output of the VUV light from the light sources 42 is not stable so that the light having a desired wavelength characteristic cannot be stably emitted to the workpiece W. For this reason, the substrate processing apparatus 1 is provided to occupy a larger height range than other processing modules adjacent to the top, bottom, left and right thereof.

The installation position of the substrate processing apparatus 1 is an example and may be changed as appropriate. For example, in the unit blocks B1 and B2, modules each configured to perform a heating process on the workpiece W may be provided at the opposite side of the resist film forming modules COT with a central transfer region interposed therebetween. The substrate processing apparatus 1 may be provided at this position. Although a processing procedure will be described later, workpieces W are processed in the substrate processing apparatus 1 after being processed in the resist film forming modules COT. In addition, the workpieces W processed by the substrate processing apparatus 1 are transferred to, for example, the rear surface cleaning modules BST. At least the processing of the workpieces W in the substrate processing apparatus 1 is performed after the processing in the resist film forming modules COT and before the transfer to the exposure apparatus S4. Therefore, by setting the arrangement of the substrate processing apparatus 1 at a position corresponding to the workpiece W transfer path from the resist film forming modules COT to the exposure apparatus S4, it is possible to improve the efficiency related to the transfer of workpieces W.

[Substrate Processing Method]

Next, a substrate processing method including the operation in the substrate processing apparatus 1 will be described. In the substrate processing method illustrated in the present embodiment, light including VUV light is emitted to the workpiece W having a resist film formed thereon using the substrate processing apparatus 1 before exposure.

Three examples of the substrate processing method including such a procedure are illustrated below.

[Substrate Processing Method-1]

Figure 7:
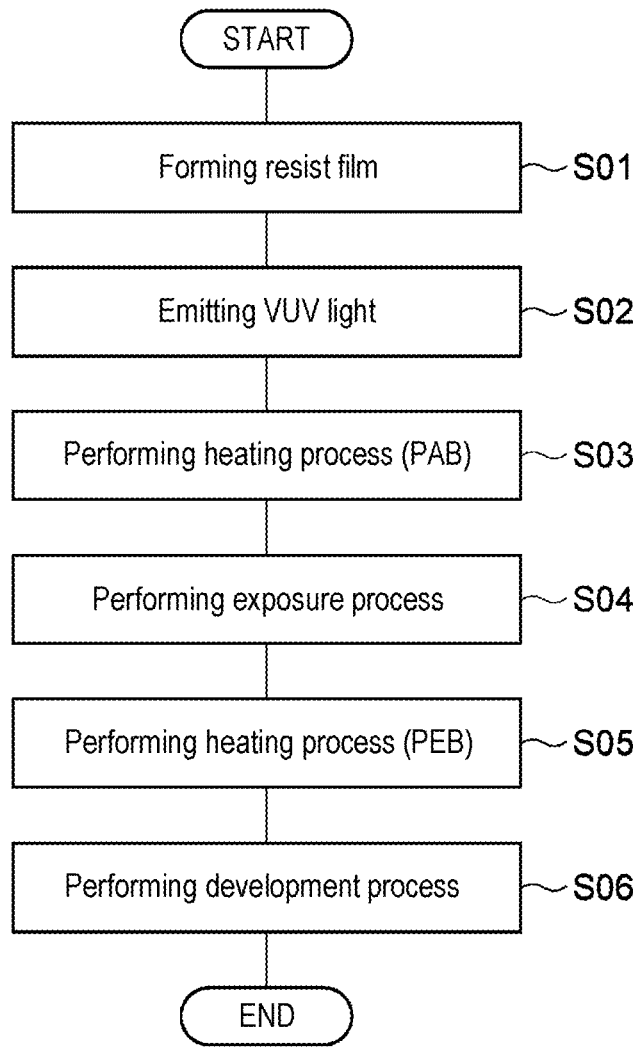
FIG. 7 is a flowchart illustrating a first example of a substrate processing method.

First, a first example will be described with reference to FIG. 7. FIG. 7 illustrates a procedure for forming a resist pattern on the workpiece W as a flowchart.

In step S01, a resist liquid is applied to the front surface of the workpiece W to form a resist film. The method for forming the resist film is not particularly limited. The workpiece W may have a lower layer film or the like formed on the front surface thereof before the resist film is formed. In this step, a resist film is formed on the entire front surface of the workpiece W.

In step S02, light including VUV light is emitted to the front surface of the workpiece W, which has the resist film formed thereon, using the substrate processing apparatus 1. Light L1 from the light sources 42 (light L1 from the lamps 44) is emitted to the workpiece W held in the housing 21 as the VUV light. The light L1 is light including VUV light. In the following embodiments, the "light L1 including VUV light" emitted from the light sources 42 may be simply referred to as "VUV light". Hereinafter, the operation of the substrate processing apparatus 1 in step S02 will be described.

Figure 8:
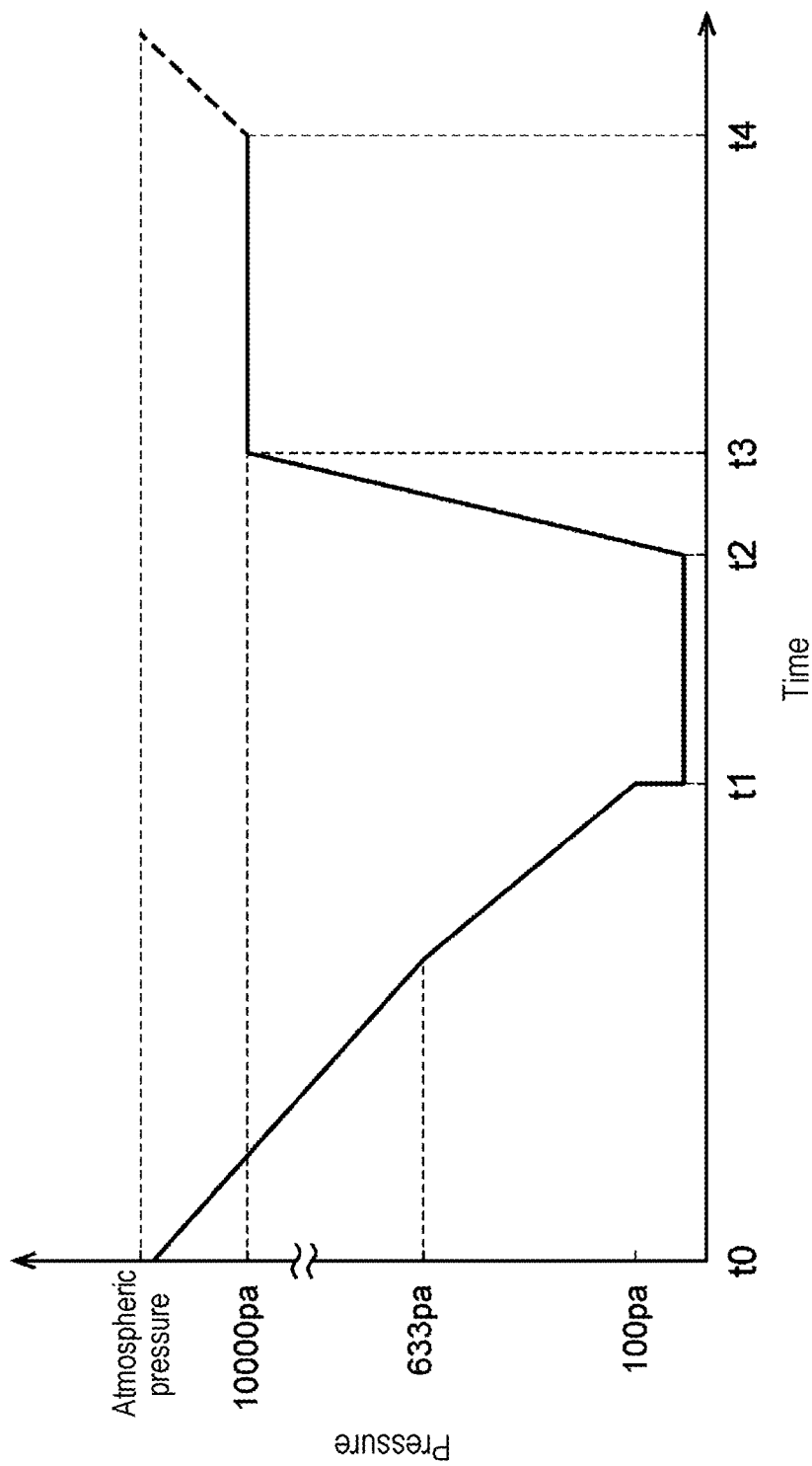
FIG. 8 is a view exemplifying a change in pressure during a substrate process in a substrate processing apparatus.

FIG. 8 is a graph showing an outline of a time-dependent change in pressure inside the housing 21. The horizontal axis of the graph of FIG. 8 represents the elapsed time during processing, and the vertical axis represents the pressure (unit: Pa) inside the housing 21, which is the processing container, wherein the vertical axis schematically represents a logarithmic axis. First, the workpiece W is carried into the housing 21 by a transfer mechanism in the state in which the operations of the gas supplier 30 and the gas discharger 35 are stopped. When the workpiece W is placed on the holder 26 of the rotary support 25, the gate valve 23 is closed to make the interior of the housing 21 airtight. At this time, the interior of the housing 21 is set to, for example, an ambient atmosphere of a standard pressure (time t0 in FIG. 8). Thereafter, the pressure inside the housing 21 is lowered by the operation of the gas discharger 35.

When the depressurization progresses and the pressure inside the housing 21 reaches 1 Pa (time t1), the pressure is maintained for a predetermined time. After the depressurized state of 1 Pa is maintained for a while (time t2), the valve 30b of the gas supplier 30 is opened and Ar gas is supplied into the housing 21. As a result, an Ar gas atmosphere is formed within the housing 21, and the pressure in the housing 21 rises. The depressurizing rate and the boosting rate may be controlled by the operations of the gas supplier 30 and the gas discharger 35. In addition, the depressurizing rate and the boosting rate may be constant or may be changed midway.

When, for example, the pressure inside the housing 21 reaches 10,000 Pa by the Ar gas, the light including the VUV light is emitted to the workpiece W from the light sources 42 in the state in which the pressure inside the housing 21 is maintained (time t3). When light is emitted from the light sources 42 for a predetermined time, for example, 30 seconds, the light emission is stopped (time t4). Thereafter, the operations of the gas supplier 30 and the gas discharger 35 are stopped, the pressure inside the housing 21 is returned to ambient atmosphere, and then the workpiece W is carried out of the housing 21. Thus, the processing of the workpiece W by the substrate processing apparatus 1 is terminated.

The amount of light per unit area (sometimes referred to as an integrated emission amount or dose) during the emission of the light including the VUV light is made smaller compared to the case in which the light including the VUV light is emitted to the front surface of the workpiece W after emitting the light to the resist pattern thereon. Specifically, the emission amount of the light including the VUV light is adjusted to be 1% to 2% compared with the case in which the light including the VUV light is emitted to the front surface of the workpiece W after forming the resist pattern through an exposure/development process to achieve an improvement in the roughness of the front surface. For example, when emitting the light including the VUV light to the resist pattern, the amount of the light including the VUV light may be adjusted to 25 mj/cm$^2$ to 100 mj/cm$^2$. Meanwhile, when the light including the VUV light is emitted to the resist film before performing the exposure process, the amount of the light including the VUV light may be adjusted to about 1 mj/cm$^2$ to 2 mj/cm$^2$. As described above, when emitting the light including the VUV light to the resist film before the exposure process, the amount of emitted light can be adjusted to be small.

The temperature rise of the workpiece W may be suppressed during the emission of the light including the VUV light. As described above, when the amount of the light including VUV light is adjusted to be small and the pressure inside the housing 21 is adjusted to be smaller than the atmospheric pressure, the temperature rise of the workpiece W itself is prevented. Therefore, the emission of the light including the above-mentioned VUV light may be performed in the state in which the temperature of the workpiece W is substantially equal to an atmospheric temperature (e.g., the temperature outside the housing 21). When the emission is performed in the state in which the temperature of the workpiece W is substantially equal to the (external) atmospheric temperature, the characteristic of the resist film is prevented from changing due to the influence of the temperature change of the workpiece W. As an example, the change in the temperature of the workpiece during the emission of the light including the VUV light may be suppressed to be less than 1 degree C. with respect to the external temperature (the temperature outside the housing 21 (room temperature)).

An example of a method of reducing the emission amount of light per unit area of the workpiece W may be, for example, reducing the light amount of the light emitted from the light sources 42 themselves (adjusting a current value). In addition, examples of other methods may include known methods, such as increasing that the distance between the front surface of the workpiece W and the light sources 42 (making adjustment such that the light sources 42 are located farther from the workpiece W) and shortening the emission time. By changing the distance between the front surface of the workpiece and the light sources 42 and changing the pressure around the optical path during the emission of the light from the light sources 42, it is possible to adjust the energy of the light reaching the front surface of the workpiece W. These methods may be combined to change the emission amount of the light including the VUV light per unit area.

As described above, in the substrate processing apparatus 1, during the light emission to the workpiece W from the light sources 42, gas supply by the gas supplier 30 and gas discharge by the gas discharger 35 are performed. Accordingly, it can be said that the Ar gas is replaced in the state in which the pressure inside the housing 21 is maintained.

During the light emission from the light sources 42 (between time t3 and time t4), the pressure inside the housing 21 may be constant or may be gradually changed. In the example illustrated in FIG. 8, the pressure inside the housing 21 is set to 10,000 Pa during the light emission from the light sources 42 in order to suppress degassing (outgassing) from the front surface of the workpiece W. However, it is considered that the degassing amount gradually decreases while the light is being emitted from the light sources 42. In this case, control may be performed to gradually decrease the pressure inside the housing 21. With this configuration, it is possible to emit light to the workpiece W in a state closer to a vacuum.

In step S03, a heating process is performed on the workpiece W after emitting the light including VUV light. The heating process in this step is a heating process for a resist film that has not been solidified and is a heat treatment called pre-applied bake (PAB).

In step S04, an exposure process is performed on the workpiece W after the heating process (PAB). In the exposure process, energy rays are emitted to an exposure target portion of the resist film formed on the workpiece W using a method such as liquid immersion exposure.

In step S05, a heating process is performed on the workpiece W after the exposure process. The heating process in this step is a heating process for a resist film that has not been solidified and is a heat treatment called post-exposure bake (PEB).

In step S06, a development process is performed on the workpiece W after the heating process (PEB). In the development process, a developer is applied on the front surface of the workpiece W and is then washed away with a rinsing liquid. As a result, a predetermined pattern is formed on the front surface of the workpiece W. A heating process (post bake (PB)) may be performed again after the development process. The coating process, the heating processes (PAB and PEB), the exposure process, and the development process described in step S01 and steps S03 to S06 may be performed using, for example, a substrate processing system including a known coating/development apparatus and an exposure apparatus. As an example, each of the processes may be performed in the above-mentioned coating and development apparatus 200.

By performing a series of processes described above, the exposure sensitivity in the resist film is improved compared with the conventional substrate processing method, and an improvement is also achieved in the roughness of the resist pattern after the exposure/development process. This point will be described.

Figure 9A:
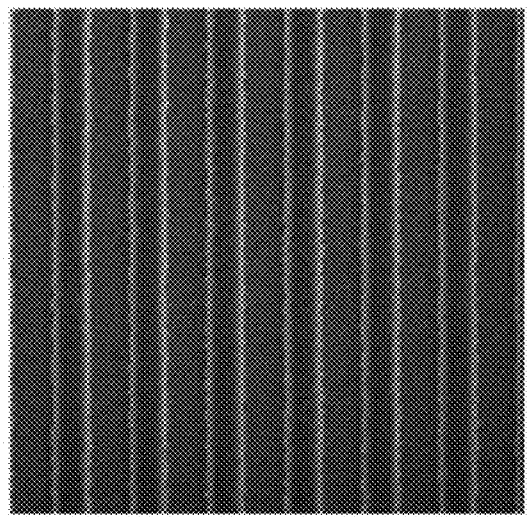
FIGS. 9A and 9B are views each showing an example of an SEM image related to a resist pattern when a processing content is changed.
Figure 9B:
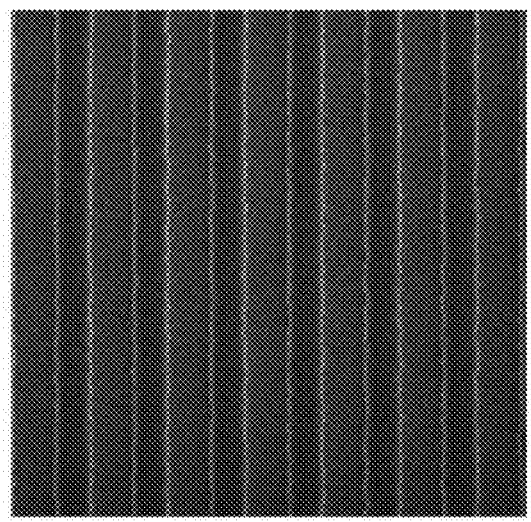

FIGS. 9A and 9B illustrate images showing a change in the shape of a resist pattern depending on the presence or absence of step S02. FIG. 9A is an SEM image showing the state of the resist pattern when step S02 was not performed and other processes were performed, and FIG. 9B is an SEM image showing the state of the resist pattern when step S02 was performed. The results shown in FIGS. 9A and 9B are the results when the resist patterns were formed under the same manufacturing conditions including the type of the resist material, except for the presence or absence of the emission of the light including the VUV light in step S02 and the exposure conditions (the effective dose amount) at the time of pattern formation. For the exposure, an exposure apparatus using a KrF light source was used. In addition, when comparing the conditions for manufacturing both resist patterns to each other, it was confirmed that the effective dose amount (dose) at the time of exposure is reduced with the emission of the light including the VUV light. The fact that the effective dose amount is reduced indicates that the sensitivity of the resist film to the emission light at the time of exposure of the resist film is increased. In addition, as a result of the emission of the light including the VUV light, it was confirmed that an improvement is also achieved in each of line edge roughness (LER) and line width roughness (LWR) related to the resist patterns. The effective dose amount was improved by 29.4% through the emission of the light including the VUV light (the effective dose amount was reduced by 29.4% through the emission of the light including the VUV light), the LER was improved by 16.5%, and the LWR was improved by 9.2%.

As described above, it was confirmed that, by emitting the light including the VUV light to the front surface of the workpiece W, which has a resist film formed thereon, before the exposure process, the sensitivity of the resist film during the exposure is increased, and thus an improvement is achieved in the roughness of the front surface after the pattern formation.

Figure 10:
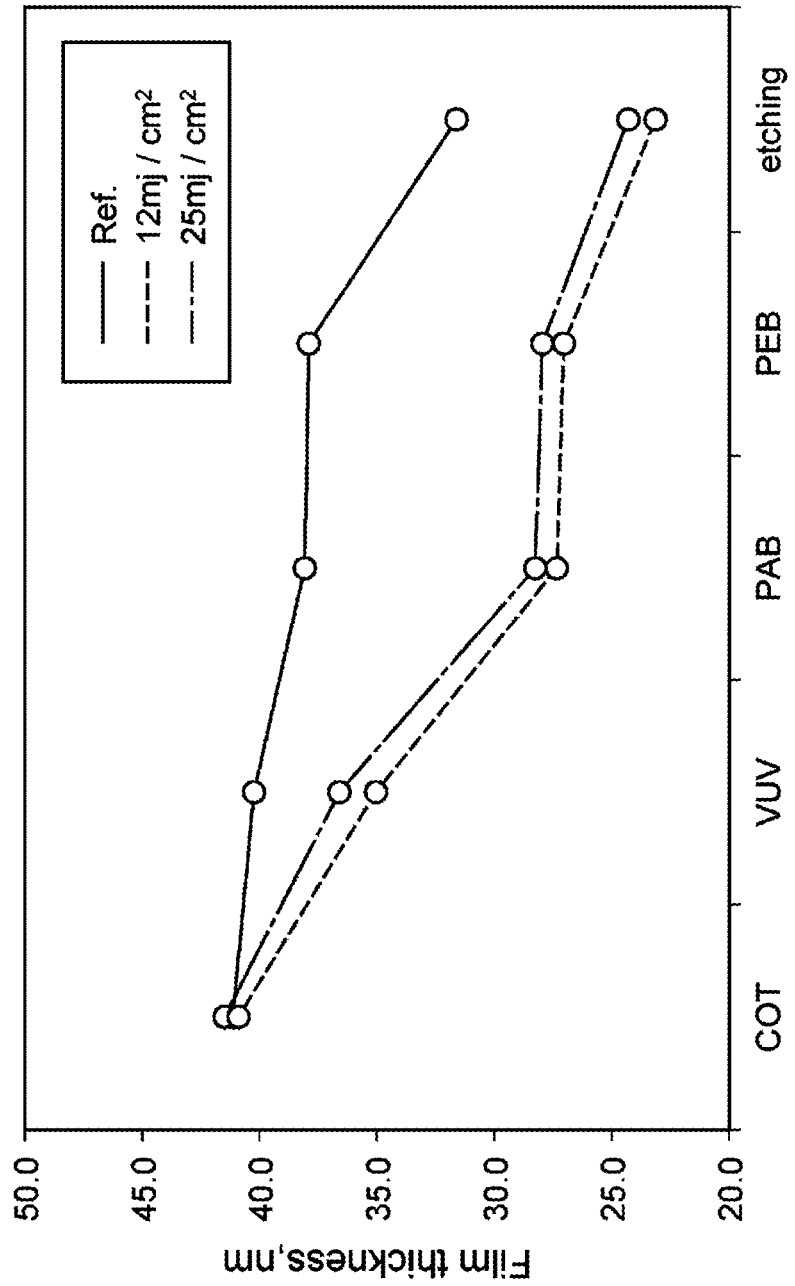
FIG. 10 is a view showing examples of changes in film thickness of resist films after respective processes.

FIG. 10 shows the results of evaluating the influence of the presence or absence of step S02, as in FIGS. 9A and 9B. In FIG. 10, after performing each of the steps, a change in the film thickness was evaluated for the resist film on which the emission of the light including the VUV light (step S02) was not performed (Ref.) and the resist films on which the emission of the light including the VUV light (step S02) was performed. In addition, as the resist films on which the emission of the light including VUV light was performed, a resist film, on which the emission amount (the integrated emission amount per unit area) was 12 mj/cm$^2$ and a resist film, on which the emission amount was 25 mj/cm$^2$, were prepared. In addition, the light L1 emitted from the light sources 42 was light having a consecutive spectrum within a wavelength range of 10 nm to 400 nm (including VUV light having a wavelength range of 10 nm to 200 nm).

"COT" indicated in FIG. 10 refers to the formation of a resist film (corresponding to step S01), and "VUV" refers to emission of the light including the VUV light (corresponding to step S02). In addition, "PAB" refers to a heating process after exposure (corresponding to step S03), and specifically, a heat treatment was performed at 130 degrees C. for 60 seconds. "PEB" refers to a heating process after exposure (corresponding to step S05), and specifically, a heat treatment was performed at 95 degrees C. for 60 seconds. In addition, "etching" refers to an etching process after the formation of a resist pattern (after development). The etching conditions were all the same, including the fact that Ar and CF$_4$ gases were used as gases to be supplied to the processing space and the processing time was set to 5 seconds to prevent a resist film from being excessively reduced. Regarding the workpieces W, on which the light emission of the light including the VUV light (step S02) was not performed, at "VUV", the workpieces W were in the state in which the emission of the light including the VUV light was not performed thereon while being disposed in the environment in which a pressure change occurred as in the case of performing the process of step S02.

According to the results shown in FIG. 10, in the workpieces W, on which the emission of the light including the VUV light (step S02) was not performed, the difference between the film thickness after the PEB and the film thickness after the etching process is approximately 5 mm or more. That is, it is considered that film reduction occurred on the resist films when the etching process was performed using a resist pattern. Meanwhile, in the workpieces W on which the emission of the light including the VUV light (step S02) was performed, the difference between the film thickness after the PEB and the film thickness after the etching processing is approximately 5 mm or less regardless of the exposure amount, and thus the film reduction during the etching process is reduced. In addition, it was confirmed that the film thickness is reduced by performing the emission of the light including the VUV light (step S02), and that the film thickness is greatly reduced by the heating process before exposure (PAB) after performing the emission of the VUV light (step S02). Furthermore, the results regarding the change in film thickness after each of the processes shown in FIG. 10 are not directly linked to the increase in sensitivity to exposure and the improvement in roughness, but are considered to be useful for estimating a change in a resist film. Details will be described later.

[Substrate Processing Method-2]

Figure 11:
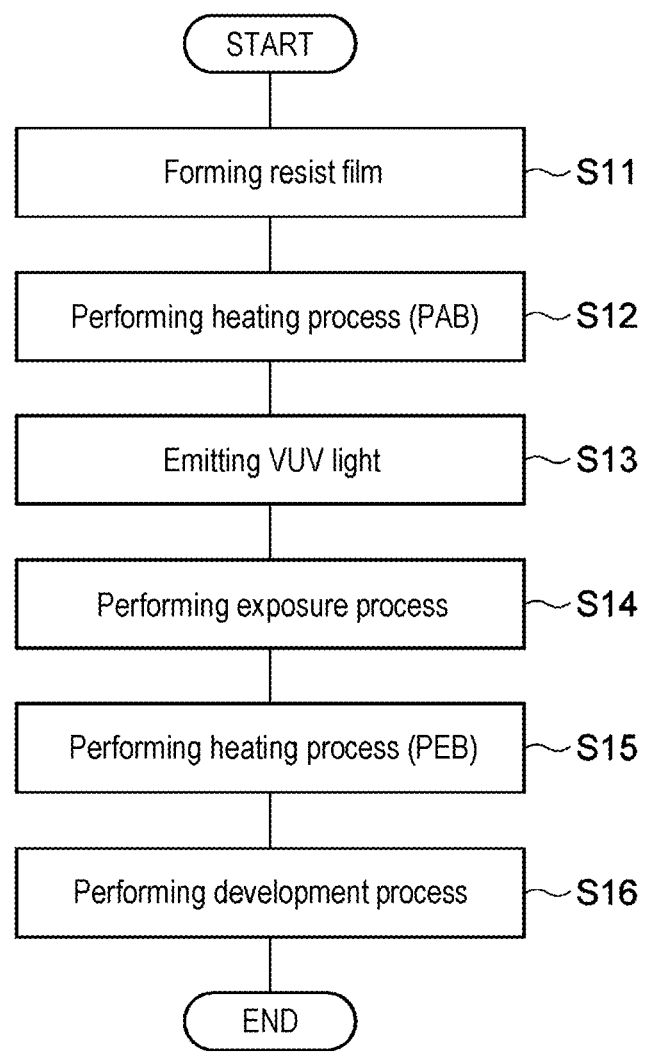
FIG. 11 is a flowchart illustrating a second example of the substrate processing method.

Next, a second example will be described with reference to FIG. 11. FIG. 11 illustrates a procedure for forming a resist pattern on the workpiece W as a flowchart. Hereinafter, the differences from the first example will be mainly described.

In step S11, a resist liquid is applied to the front surface of the workpiece W to form a resist film. The method for forming the resist film is not particularly limited.

In step S12, a heating process is performed on the workpiece W having a resist film formed thereon. The heating process in this step is a heating process for a resist film that has not been solidified and is a heat treatment called pre-applied bake (PAB).

In step S13, light including VUV light is emitted to the front surface of the workpiece W, which has the resist film formed thereon, using the substrate processing apparatus 1. The operation procedure of the substrate processing apparatus 1 when emitting the light including the VUV light is the same as that in the first example.

In step S14, an exposure process is performed on the workpiece W after emitting the light including the VUV light to the workpiece W. In the exposure process, energy rays are emitted to an exposure target portion of the resist film formed on the workpiece W using a method such as liquid immersion exposure.

In step S15, a heating process is performed on the workpiece W after the exposure process. The heating process in this step is a heating process for a resist film that has not been solidified and is a heat treatment called post-exposure bake (PEB).

In step S16, a development process is performed on the workpiece W after the heating process (PEB). In the development process, a developer is applied on the front surface of the workpiece W and is then washed away with a rinsing liquid. As a result, a predetermined pattern is formed on the front surface of the workpiece W. In addition, a heating process (post bake (PB)) may be performed again after the development process.

With the second example, the exposure sensitivity in the resist film is also improved compared with the conventional substrate processing method, and an improvement is also achieved in the roughness of the resist pattern after the exposure/development process.

Figure 12:
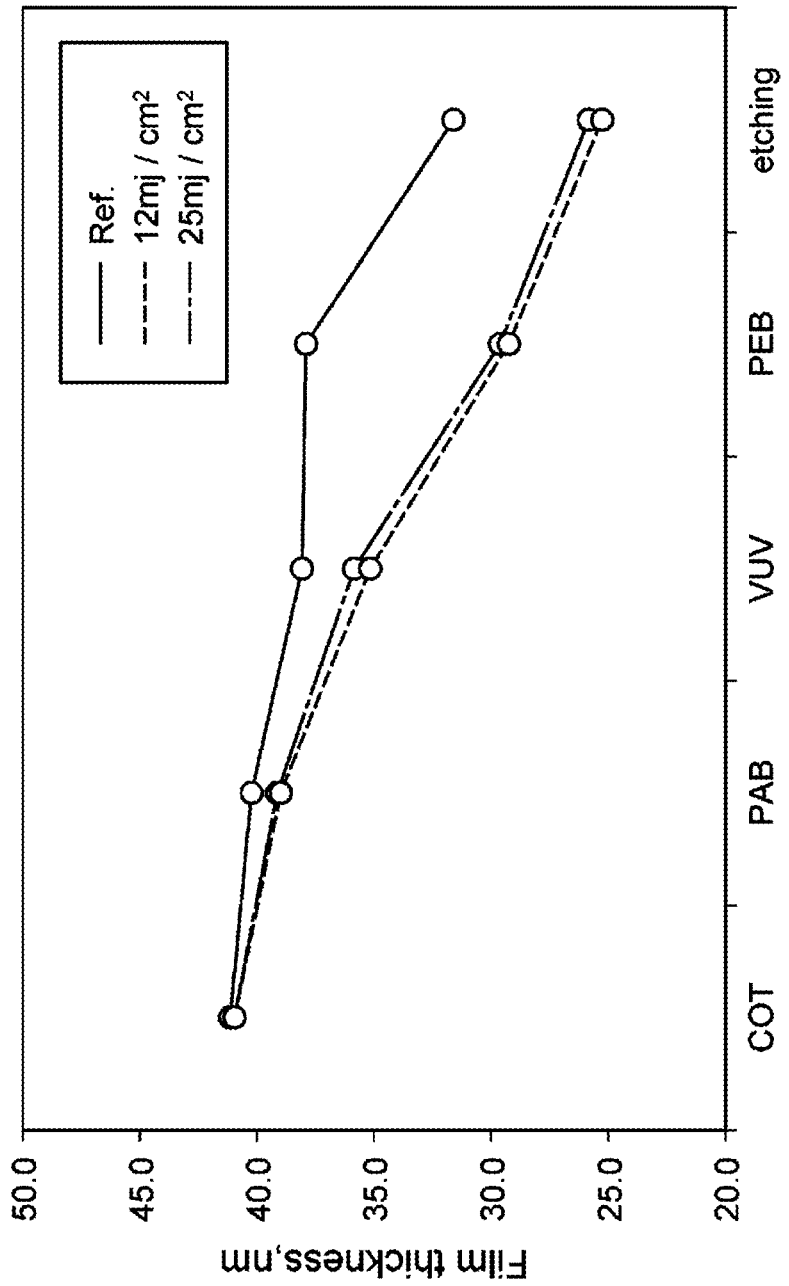
FIG. 12 is a view showing examples of changes in film thickness of resist films after respective processes.

FIG. 12 shows the results of evaluating the influence of the presence or absence of step S02, as in FIG. 10. As in FIG. 10, in FIG. 12, after performing each step, a change in the film thickness was evaluated for resist films on which emission of the light including the VUV light (step S02) was not performed (Ref.) and resist films on which emission of the light including the VUV light (step S02) was performed. In addition, as the resist films on which the emission of the light including the VUV light, resist films, on which the exposure amount was 12 mj/cm$^2$, and resist films, on which the exposure amount was 25 mj/cm$^2$, were prepared. The above description for the characters is equally applied to the characters in the figure. Since the order of processes is different, the described order is different from that in FIG. 10.

In the results shown in FIG. 12 as well, in the workpieces W on which the emission of the light including the VUV light (step S02) was not performed, the difference between the film thickness after the PEB and the film thickness after the etching process of the workpieces W is approximately 5 mm or more. That is, it is considered that film reduction occurred on the resist films when the etching process using a resist pattern was performed. Meanwhile, in the workpieces W on which the emission of the light including the VUV light (step S02) was performed, the difference between the film thickness after the PEB and the film thickness after the etching process is approximately 5 mm or less regardless of the exposure amounts, and thus the film reduction during the etching process is reduced. In addition, it was confirmed that the film thickness is reduced by performing the emission of the light including the VUV light (step S02), and that the film thickness is greatly reduced by the heating process after exposure (PEB) after performing the emission of the light including the VUV light (step S02).

According to the results shown in FIGS. 10 and 12, it was confirmed that the film reduction during the etching process is reduced by performing the emission of the light including the VUV light compared with the case in which no light emission was performed. From these results, it was confirmed that etching resistance was improved by performing the emission of the light including the VUV light. Meanwhile, in the results shown in FIG. 8, it was confirmed that the film reduction after the PAB is large, whereas in the results shown in FIG. 10, the film reduction after the PEB is large. From this, it was confirmed that etching resistance is improved according to the emission of the light including the VUV light regardless of the order of the PAB and the emission of the light including the VUV light.

In both of the results shown in FIGS. 10 and 12, the film thickness is reduced by performing the emission of the light including the VUV light compared with the case in which the emission of the light including the VUV light is not performed. According to the results shown in FIG. 10, the decrease in film thickness (volume shrinkage) due to the heating process (PAB) performed after the emission of the light including the VUV light becomes larger compared with other processes. According to the results shown in FIG. 12, the decrease in film thickness (volume shrinkage) due to the heating process (PEB) performed after the emission of the light including the VUV light becomes larger compared with other processes. Considering these phenomena, when the light including the VUV light is emitted, the reduction of the film thickness by the subsequent heating increases. Therefore, the possibility of reducing heating processes on a resist film in a series of processes is conceivable.

[Substrate Processing Method-3]

Figure 13:
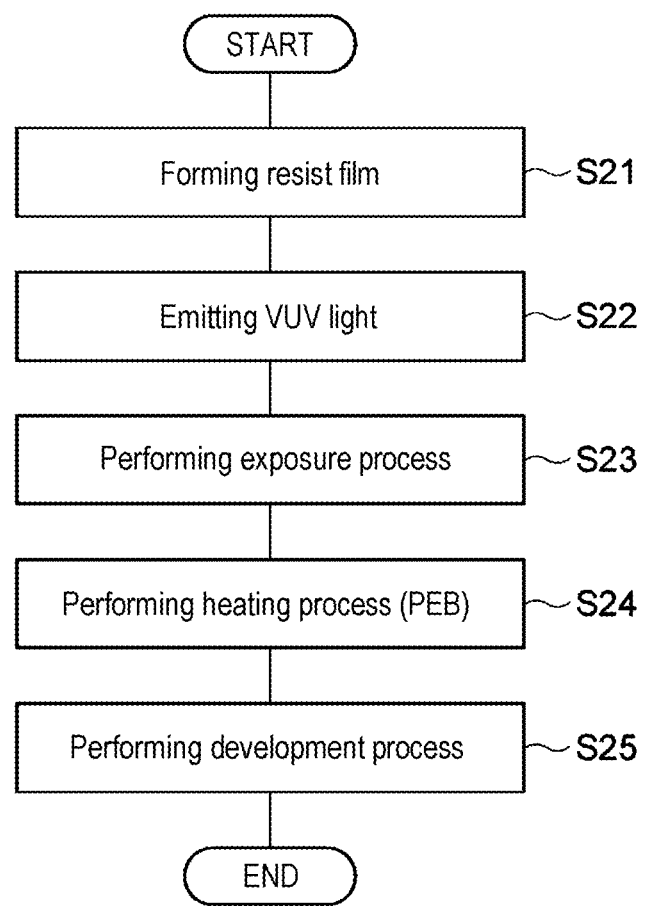
FIG. 13 is a flowchart illustrating a third example of the substrate processing method.

Next, a third example will be described with reference to FIG. 13. FIG. 13 illustrates a procedure for forming a resist pattern on the workpiece W as a flowchart. The third example is different from the first example in that "PAB" is not performed.

That is, in step S21, a resist liquid is applied to the front surface of the workpiece W to form a resist film. The method for forming the resist film is not particularly limited.

In step S22, light including VUV light is emitted to the front surface of the workpiece W, which has the resist film formed thereon, using the substrate processing apparatus 1. The operation procedure of the substrate processing apparatus 1 when emitting the light including the VUV light is the same as that in the first example.

In step S23, an exposure process is performed on the workpiece W after emitting the light including the VUV light. In the exposure process, energy rays are emitted to an exposure target portion of the resist film formed on the workpiece W using a method such as liquid immersion exposure.

In step S24, a heating process is performed on the workpiece W after the exposure process. The heating process in this step is a heating process for a resist film that has not been solidified and is a heat treatment called post-exposure bake (PEB).

In step S25, a development process is performed on the workpiece W after the heating process (PEB). In the development process, a developer is applied on the front surface of the workpiece W and is then washed away with a rinsing liquid. As a result, a predetermined pattern is formed on the front surface of the workpiece W. A heating processing (post bake (PB)) may be performed again after the development process.

Even with the third example, the exposure sensitivity in the resist film is improved compared with the conventional substrate processing method by the emission of the light including the VUV light, and an improvement is also achieved in the roughness of the resist pattern after the exposure/development process.

In the third example, by reducing the number of heating processes, it is possible to increase the exposure sensitivity through the emission of the light including the VUV light as well as to increase an improvement effect in roughness of a resist pattern.

For the purpose of emitting the light including the VUV light to the workpiece W coated with a resist liquid after the workpiece W is carried into the space inside the housing 21 and before emitting the light including the VUV light from the light sources 42, depressurization may be performed in order to reduce the oxygen concentration inside the space. This causes the volatilization of the solvent to proceed in the resist liquid, so the permeation of the above-described VUV light into the resist film is further promoted.

In addition, it may be possible to adopt a configuration in which the PAB is not performed as described above when the process of emitting the light including the VUV light is completed in the state in which the fluidity of the resist liquid is lost and the resist liquid is solidified to the extent that a pattern can be formed in the exposure and development process due to the progress of the volatilization of the solvent in the resist liquid. In this case, as described above, it is possible to prevent excessive thermal energy from being applied before exposure, and it is also possible to implement time reduction by reducing steps.

Meanwhile, it is also possible to adopt a configuration in which the PAB is performed on the workpiece W as described above depending on the purpose, for example, to give heat energy in an auxiliary manner according to the state of the resist after the process of emitting the light including the VUV light or to use heat energy as additional means for controlling the film quality of the resist before exposure.

Figure 14:
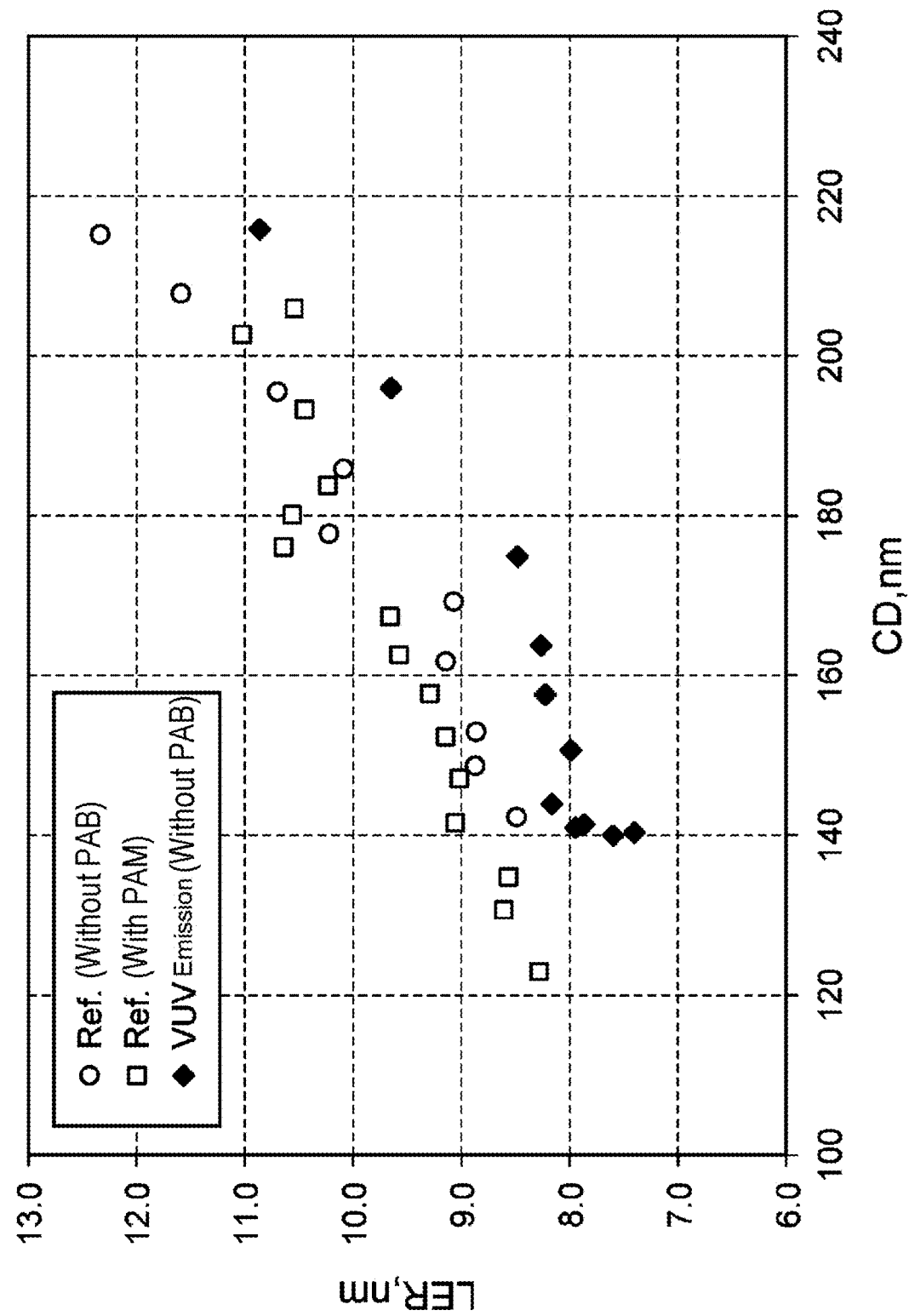
FIG. 14 is a view showing an example of LER relative to CD of each resist pattern.

FIG. 14 shows the results of measurement of LER with respect to a line width (critical dimension (CD): limit line width) of each resist pattern when the third example was implemented. That is, when resist patterns were formed to have respective line widths, it was evaluated how the roughness (LER) of each resist pattern changed. FIG. 14 shows LER relative to CD when a heating process before exposure (PAB) was not performed with respect to the case in which the emission of the light including the VUV light was performed (similar to the procedure illustrated in FIG. 13). In addition, with respect to the case in which the emission of the light including the VUV light was not performed (Ref.), FIG. 14 shows a case without PAB and a case with PAB.

According to the results shown in FIG. 14, by comparing two results obtained in the case in which the emission of the light including the VUV light was not performed (Ref.), it was confirmed that the LER at each line width is increased by performing the heating process before exposure (PAB). Meanwhile, it was confirmed that by performing the emission of the light including the VUV light, a further improvement in the LER is achieved compared with the case in which the emission of the VUV light was not performed (Ref.) and the heating process before exposure (PAB) is not performed. As described above, it was confirmed that, through the emission of the light including the VUV light to the resist pattern before forming a resist pattern, an improvement in the LER of the resist pattern is achieved.

According to the results shown in FIG. 14, it was confirmed that for a resist pattern, an improvement is achieved in the LER for each line width even if the heating process before exposure (PAB) is omitted. That is, it was confirmed that even when a resist pattern was formed on the basis of the method illustrated in the third example, a resist pattern improved in the surface roughness is obtained.

[Study on Effect of Emission of Light Including VUV Light]

As described in the above-described embodiments, it was confirmed that, when light including VUV light is emitted to a resist film before an exposure process is performed on the resist film, the sensitivity at the time of exposure is improved. In addition, it was confirmed that a resist pattern obtained through an exposure/development process is improved in etching resistance and is also improved in the surface roughness of the resist pattern. The background in which the emission of the light including the VUV light affects a resist film and a resist pattern as described above will be described with reference to FIGS. 15A to 15D.

Figure 15A:
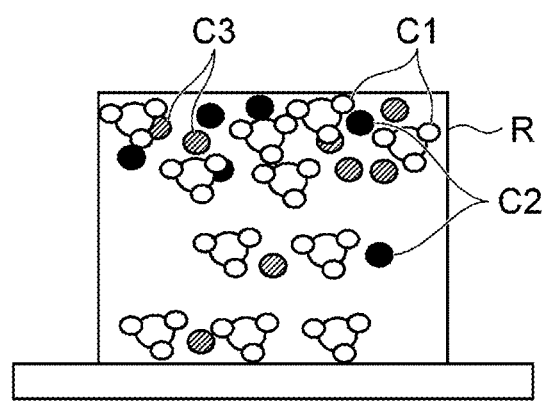
FIGS. 15A to 15D are views each schematically illustrating an example of an internal state of a resist film at the time of each process.
Figure 15B:
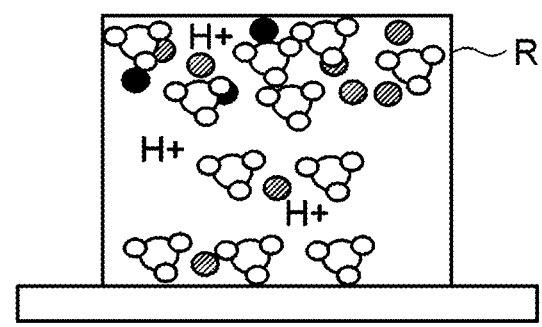
Figure 15C:
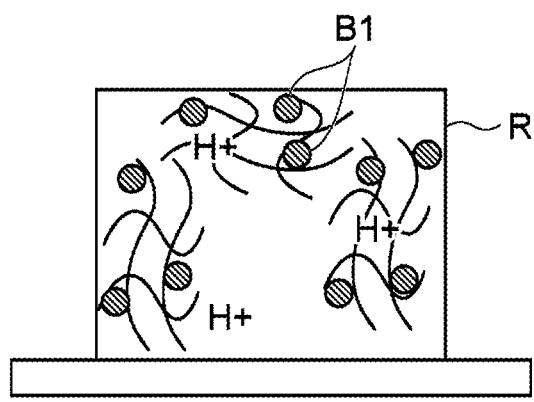
Figure 15D:
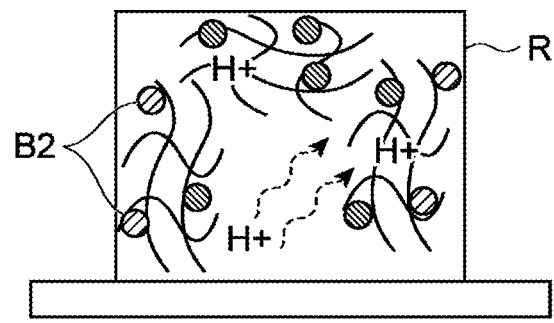

FIGS. 15A to 15D schematically illustrate the internal states of a resist film R in respective steps included in a process of forming a resist pattern. FIG. 15A illustrates the state in which the resist film is formed on the workpiece W. FIG. 15B illustrates the state of the resist film after emitting the light including the VUV light. FIG. 15C illustrates the state of the resist film after exposure. FIG. 15D illustrates the state of the resist film after a heating process after exposure (PEB).

As an example, a resist material forming a resist film for EUV lithography may take a state in which a polymer (high molecule), an acid generator (a photosensitive agent), and a quencher (base) are diffused in a solvent. In a resist material composed of such components, the acid generator is decomposed at the time of exposure, and thus an acid is finally generated, whereby mask information is transferred to the resist as an acid image. Thereafter, it is known that an acid-catalyzed reaction proceeds by performing heating after exposure (PEB).

As illustrated in FIG. 15A, when a resist film R is formed, so-called layer separation occurs in which a polymer C1, an acid generator C2, and a quencher C3 stay in an upper layer compared with a lower layer, inside the film. Meanwhile, the light emitted to the resist film from the light sources 42 is able to reach a deeper layer (lower layer) of the resist film when the light has a longer wavelength and a higher intensity. However, since a part of a spectrum of light emitted from the light sources 42 has a peak wavelength included in a VUV light band (10 nm to 200 nm) as described above (more accurately, includes light having a wavelength band of about 100 nm to 200 nm), the light emitted from the light sources 42 has a relatively long wavelength and a relatively low intensity. Therefore, a small amount of light emitted from the light sources 42 reaches the deep layer of the resist film. In other words, both light having a short wavelength and light having a long wavelength reach the surface layer (the upper layer) in which a large amount of respective components of the resist material is present, while only the light having a long wavelength reaches the deep layer (the lower layer) in which a small amount of respective components of the resist material is present. As the entire resist film, the light including the VUV light is emitted to each portion to the extent corresponding to the distribution of components of the resist material.

FIG. 15B illustrates a reaction state in the resist film R through the emission of the light including the VUV light. When the VUV light is emitted, the main chains of the polymer are decomposed (cleaved), and thus the stress of the resist film R is relaxed. Meanwhile, since the acid generator C2 in the resist film R is decomposed through the emission of the VUV light, an acid ($H^+$) is generated. In addition, the emission of the light including the VUV light is performed between time t3 and time t4 in FIG. 8. Thereafter (after time t4), the interior of the housing 21 is returned to an ambient atmosphere. At this time, the acid ($H^+$) generated inside the resist film R moves inside the film with the stress change inside the film due to the change in the surrounding atmosphere. Therefore, the acid is diffused inside the resist film R.

In the resist film, a cross-linking reaction also occurs during and after the emission of the light including the VUV light. Therefore, the front surface of the resist film is cured, and as a result, the etching resistance is increased. In addition, when a process is performed in the substrate processing apparatus 1, as shown in FIG. 8, the process is performed in the state closer to a vacuum than the atmospheric pressure. Therefore, it is considered that some of the solvent inside the resist film scatters outward from the resist film R during the process.

FIG. 15C illustrates the reaction state of the resist film R by exposure. The light emitted during the exposure further promotes the cross-linking reaction in the resist film R. Therefore, the region of the resist film R that serves as the surface of the pattern will be cured.

FIG. 15D illustrates the state in which acid ($H^+$) is generated in the resist film R through the heating process after exposure (PEB), and deprotection of protecting groups B1 proceeds. A development processing is performed in this state. It is considered that the developer used in the development process has a structure hydrated with water molecules. Therefore, it is considered that the developer easily binds to polar portions (deprotected groups B2), and therefore, it is considered that the developer easily permeates into the resist film R if a large number of polar portions are present. In addition, when the acid ($H^+$) is diffused inside the resist film R, the developer easily permeates into the region in which a large number of acid ions are present. That is, since the number of polar portions (deprotected groups) increases when the deprotection progresses, the developer more easily permeates. In addition, the developer easily permeates into the resist film R even when a large amount of solvent remains in the resist film R.

When exposure/development is performed without performing a heating process (PAB) after emitting the light including the VUV light, it is considered that the proportion of the solvent remaining in the film R is high as the entire resist film R. Therefore, it can be estimated that the permeability of the developer will be increased. However, in fact, the result of an improvement in LER was confirmed (FIG. 14). From this, when emitting the light including the VUV light, it can be said that, even when a heating process (PAB) is not performed, a sufficient cross-linking reaction for forming a resist pattern improved in roughness or a decomposition reaction by the VUV light for causing stress relaxation in the film is in progress. Therefore, even when a heating process (PAB) after the emission of the light including the VUV light is omitted, an improvement in the roughness is achieved while the etching resistance of the resist pattern is improved.

Even when the emission of the light including the VUV light is performed after performing the heating process before exposure (PAB) as in the second example, decomposition of main chains, diffusion of acid ($H^+$), and progress of the cross-linking reaction may be promoted by the emission of the light including the VUV light. Therefore, as illustrated in the description made with reference to FIGS. 9A and 9B, the sensitivity to exposure can be increased. However, in addition to the evaporation of the solvent inside the resist film R in the heating process (PAB), the solvent may also be evaporated during the emission of the light including the VUV light. Therefore, during the development process, the amount of internal solvent becomes very small as a whole regardless of the presence or absence of the emission of light during exposure. Therefore, the entire resist film R is in the state in which the developer easily permeates into the resist film R, and thus, the resist pattern may collapse. This also applies to the case in which the heating process (PAB) is performed after emitting the light including the VUV light. Therefore, in consideration of this, it is required to set the conditions for each process when the heating process (PAB) is performed. In view of the fact that the cross-linking reaction partially proceeds through the emission of the VUV light as described above, it is considered that the evaporation of the solvent from the entire resist film R can be suppressed by performing the heating process (PAB) after emitting the light including the VUV light. Therefore, it is considered that the etching resistance of the resist pattern can be improved by performing the heating process (PAB) after the emission of the light including the VUV light as illustrated in the above-described first example. It is considered that the evaporation of the solvent due to heating can be suppressed by performing the heating process (PAB) at a low temperature and in a short time. Therefore, it is considered that the influence on the resist film can be adjusted by adjusting the heating conditions even when the heating process (PAB) is performed.

[Modified Example of Substrate Processing Method]

FIG. 16 illustrates a modified example of the substrate processing method. The modified example illustrated in FIG. 16 is obtained by adding a process of changing the heating conditions depending on a change of the surface of a resist film due to the emission of light including VUV light compared with the first example described above. Therefore, except for the changes, a brief explanation will be given.

In step S31, a resist liquid is applied to the front surface of the workpiece W to form a resist film. As a result, the resist film is formed on the entire front surface of the workpiece W.

In step S32, light including VUV light is emitted to the front surface of the workpiece W, which has the resist film formed thereon, using the substrate processing apparatus 1. Light L1 from the light sources 42 is emitted to the workpiece W held in the housing 21 as the light including the VUV light.

In step S33, after emitting the VUV light to the workpiece W, the surface of the workpiece W is evaluated. In addition, in step S34, the heating conditions are adjusted depending on the evaluation results of the front surface of the workpiece W.

As an example, in step S33, the change in the film thickness of the resist film is measured. As described above, how much the internal change is changed by the VUV light is evaluated on the basis of, for example, the reduced amount of the film thickness. Then, on the basis of the evaluation results, the conditions of the heating process in the subsequent step are adjusted. The contents of adjustment include, for example, whether or not to perform a heating process before exposure (PAB), the heating temperature at the time of performing the heating process (PAB), the heating time, and the like. It may be possible to adopt a configuration in which heating conditions are also adjusted for a heating process after exposure (PEB).

Step S35 and subsequent steps are performed on the basis of the results of the adjustment of the heating conditions (step S34). In step S35, a heating process is performed on the workpiece W after emitting the light including the VUV light to the workpiece W. The heating process in this step is a heating process for a resist film that has not been solidified and is a heat treatment called pre-applied bake (PAB).

In step S36, an exposure process is performed on the workpiece W after the heating process (PAB). In the exposure process, energy rays are emitted to an exposure target portion of the resist film formed on the workpiece W using a method such as liquid immersion exposure.

In step S37, a heating process is performed on the workpiece W after the exposure process. The heating process in this step is a heating process for a resist film that has not been solidified and is a heat treatment called post-exposure bake (PEB).

In step S38, a development is performed on the workpiece W after the heating process (PEB). In the development process, a developer is applied on the front surface of the workpiece W and is then washed away with a rinsing liquid. As a result, a predetermined pattern is formed on the front surface of the workpiece W. A heating process (post bake (PB)) may be performed again after the development process.

When processes are performed according to the procedure illustrated in FIG. 16, since the heating process can be performed in consideration of the influence of the VUV light, for example, it becomes easy to prevent the collapse of the resist pattern, deterioration in the roughness, or the like, which may be caused due to an excessive heating process or the like.

Instead of adding steps S33 and S34, a series of processing conditions in the previous steps may be changed, for example, by evaluating the workpiece W after a process (after forming the resist pattern). As an example, it may be possible to adopt a configuration in which the uniformity of a line width of a resist pattern is measured or estimated, and various conditions related to exposure, emission time or emission amount of the VUV light, and the like are adjusted from the measured or estimated results.

[Relationship Between Wavelength Distribution of Light Including VUV Light and Effect]

The light emitted to the workpiece W in the substrate processing apparatus 1, that is, the light emitted from the light emission mechanism 40 is light including vacuum ultraviolet light (VUV light) as described above. The wavelength of the light emitted from the light emission mechanism 40 may be closely related to an improvement in sensitivity when exposing a resist film and an improvement in the uniformity of a line width in a resist pattern. This point will be described with reference to FIG. 17.

Figure 17:
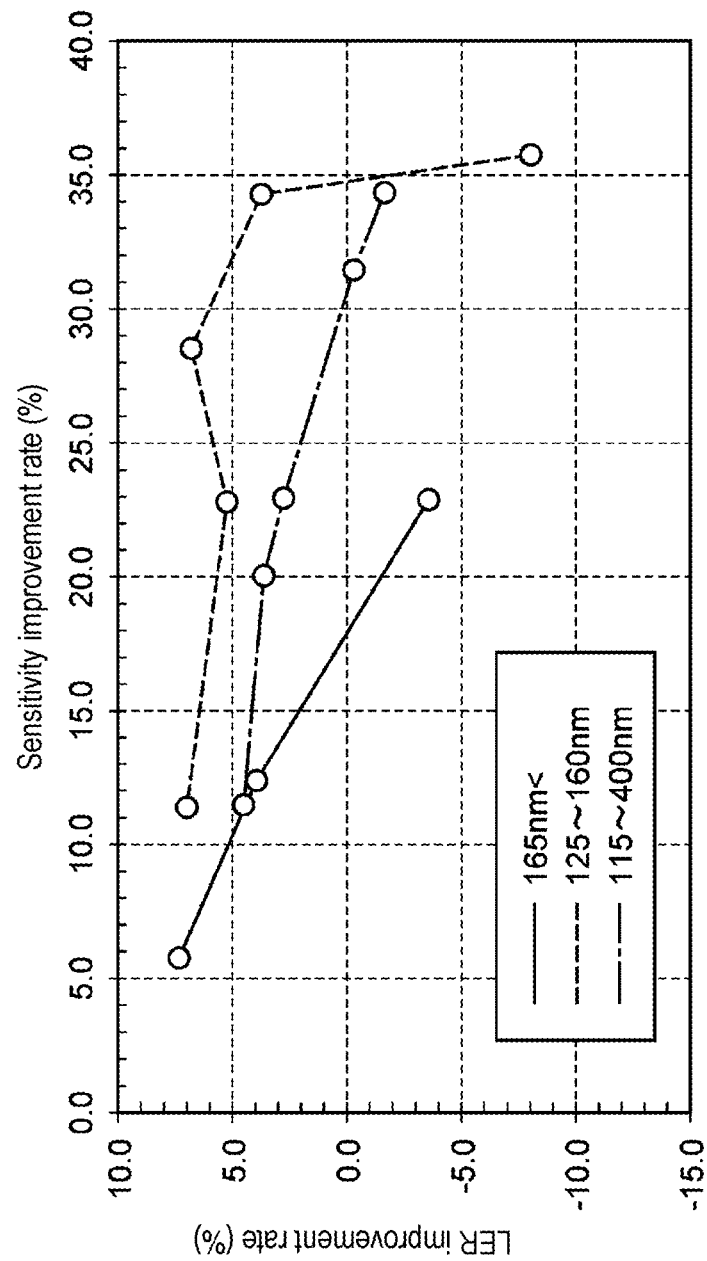
FIG. 17 is a view illustrating an evaluation example of a relationship between wavelengths of light emitted from the light sources in the substrate processing apparatus and improvement rates in sensitivity and LER.

FIG. 17 illuminates the results of evaluating a relationship between an improvement rate (increasing rate) in the sensitivity of a resist film to emission light at the time of exposure and a line edge roughness (LER) improvement rate regarding resist patterns. In particular, FIG. 17 illustrates the results when the wavelength of light emitted from a light source 42 (a lamp 44) is limited to specific wavelengths. Specifically, the results obtained by performing evaluation on three patterns in the case in which the wavelength range of emission light from the light source 42 is longer than 165 nm, in the case in which the wavelength range is 125 nm to 160 nm, and in the case in which the wavelength range is 115 nm to 400 nm are illustrated. The wavelength range of 115 nm to 400 nm is a condition in which a deuterium lamp normally used as the lamp 44 is used as it is. Meanwhile, the case in which the wavelength range is longer than 165 nm and the case in which the wavelength range is 125 nm to 160 nm refer to the cases in which the wavelength ranges were adjusted by causing the light emitted from the deuterium lamp to pass through a filter that transmits only a predetermined wavelength range (e.g., a bandpass filter). For light of each wavelength, the emission amount of light (the amount of the light including the VUV light) is changed in the range of about 0.3 mj/cm$^2$ to 2 mj/cm$^2$. In any of the results, there is a tendency that the sensitivity improvement rate increases as the amount of light increases.

According to the results shown in FIG. 17, in the results obtained when the wavelength range is 115 nm to 400 nm under the condition in which the deuterium lamp is used as it is, the sensitivity gradually increases when the emission amount of light (the amount of the light including the VUV light) is changed to about 0.5 mj/cm$^2$ to about 1.1 mj/cm$^2$. Meanwhile, while the sensitivity gradually increases, the LER improvement rate decreases. The tendencies obtained in the other two results are similar to this tendency.

Meanwhile, in the case in which the wavelength range of the emission light from the light source 42 is longer than 165 nm, the sensitivity gradually increases and the LER improvement rate decreases when the emission amount of light (the amount of the light including the VUV light) is changed to about 0.6 mj/cm$^2$ to 1.9 mj/cm$^2$. In the case in which the wavelength range of the emission light from the light source 42 is 125 nm to 160 nm, when the emission amount of light (the amount of the light including the VUV light) is changed to about 0.3 mj/cm$^2$ to about 0.6 mj/cm$^2$, the sensitivity gradually increases and the LER improvement rate decreases. However, comparing these two results, in the case in which the wavelength range of the emission light is longer than 165 nm, it was confirmed that the decrease in the LER improvement rate relative to the sensitivity increase rate is remarkable compared to that in the case in which the wavelength range of the emission light is 125 nm to 160 nm. In the case in which the wavelength range of the emission light is 125 nm to 160 nm, it was confirmed that until the sensitivity improvement rate (increasing rate) becomes about 35%, the LER improvement rate is 0% or more and that both the increase in sensitivity and the improvement in LER are achieved. In other words, in the case in which the wavelength range of the emission light is 125 nm to 160 nm, the sensitivity can be improved to a high level of about 35% without causing deterioration in LER. In particular, when comparing the results in the case in which the wavelength range of the emission light is 125 nm to 160 nm with the results in the case in which the wavelength range is 115 nm to 400 nm (a deuterium lamp), the LER improvement rate is high under the condition in which the same sensitivity increase rate is achieved. From this, it was confirmed that in the case in which the wavelength range of the emission light is 125 nm to 160 nm, a state in which improvements are achieved in both sensitivity and LER is obtained.

Figure 18:
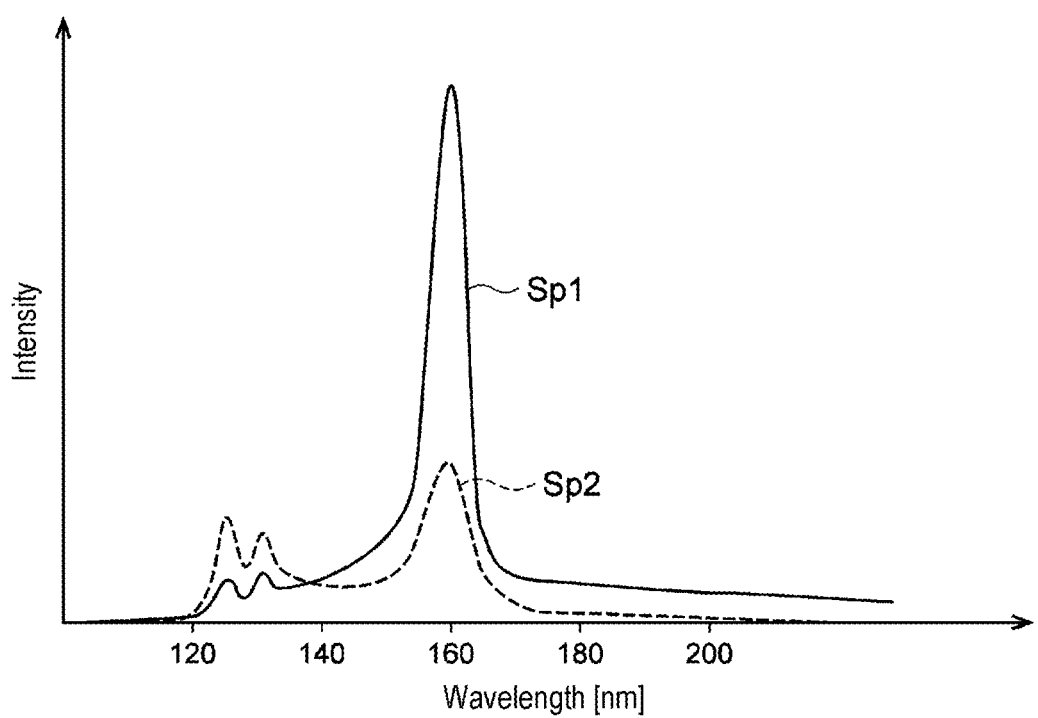
FIG. 18 is a view illustrating examples of spectrums of light emitted from the light sources in the substrate processing apparatus.

The above results will be reviewed with reference to the exemplary spectra shown in FIG. 18. The spectrum Sp1 shown in FIG. 18 schematically shows the wavelength range of 100 nm to 220 nm in the spectrum of a deuterium lamp usually used in a light source 42. As shown in the spectrum Sp1, the deuterium lamp has a high peak near the wavelength of 160 nm. Therefore, when the emission light emitted from the light source 42 is viewed as a whole, the components in the wavelength region constituting the peak near the wavelength of 160 nm are contained in the largest amount. In addition, although the light in other wavelength ranges is included in the light emitted from the light source 42, the proportion thereof to the entire emission light is low.

Meanwhile, the spectrum Sp2 schematically shows the spectrum of light after passing through a filter such that the wavelength range of the emission light is 125 nm to 160 nm in the evaluation results shown in FIG. 17. The spectrum Sp2 is also derived from the characteristics of the filter, but the peak of light near the wavelength 160$n$ becomes lower than that of the spectrum Sp1. As a result, the light components in the wavelength range of 125 nm to 160 nm are uniform to some extent. That is, the intensities of light of respective wavelengths are closer to each other. In other words, when the emission light emitted from the light source 42 is viewed as a whole, the proportion of the components in the wavelength region constituting the peak near the wavelength of 160 nm becomes low, and the proportion of the components in the other wavelength regions becomes high.

As described with reference to FIG. 15, by emitting the light including the VUV light as the emission light, decomposition of main chains, diffusion of acid ($H^+$), and progress of a cross-linking reaction can be promoted. In addition, the light emitted from the light source 42 to the resist film can reach the deeper layer (the lower layer) of the resist film when the wavelength of the light is longer and the intensity of the light is higher. Therefore, when a large amount of light having a long wavelength band is included, the light including the VUV light can be emitted to the entire resist film. Meanwhile, since the improvement in LER is derived from the curing of the resist film on the surface of the resist film, it is required to promote the reaction in the resist film formed in the vicinity of the surface of the resist film in order to more remarkably modify the surface of the resist film by the emission light. Therefore, it is considered that it is important for the emission light to contain a large amount of components on the short wavelength side in achieving both the improvement in sensitivity and the improvement in LER. From this, considering both the improvement in sensitivity and the improvement in LER, it is considered that it is more effective to use, as the emission light, light having the shape shown in the spectrum Sp2, that is, having a small deviation in the distribution of light of each wavelength, rather than the shape shown in the spectrum Sp1.

Figure 19:
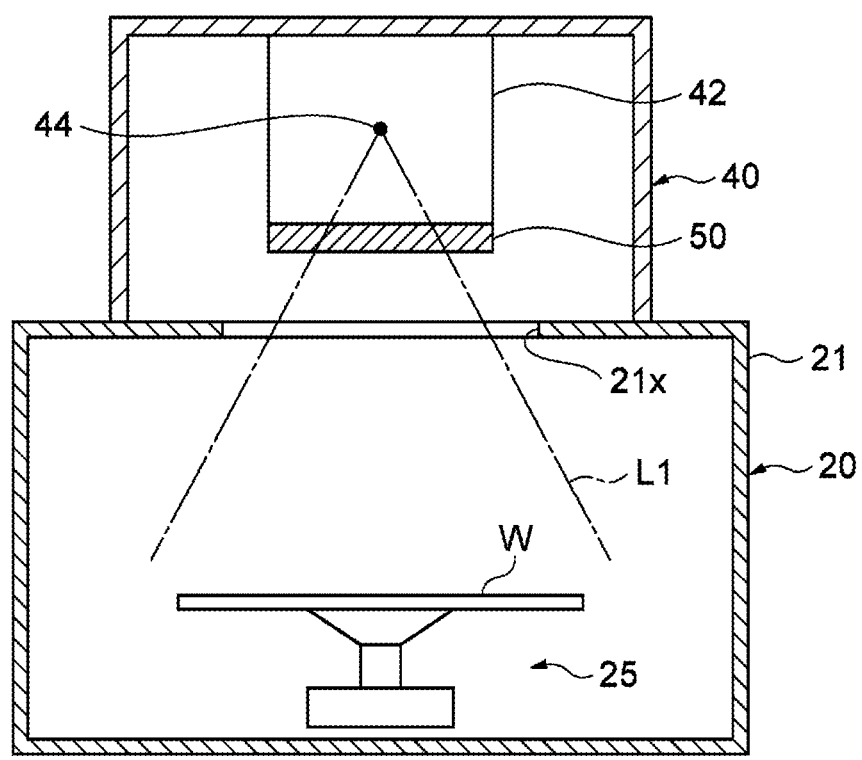
FIG. 19 is a view illustrating an example of a method of changing a spectrum of light from a light source in a substrate processing apparatus.

As a method for reducing the deviation of the distribution of light for each wavelength in the light emitted from the light source 42 to the workpiece W, it is conceivable to change the lamp 44 to one having a characteristic suitable for the method. In addition, as illustrated in FIG. 19, a method of causing the light emitted from a light source 42 to pass through a filter 50 (a light adjustment member), the light transmittance of which has been adjusted for each wavelength, and then emitting the light to the workpiece W may be considered. The characteristics of the filter 50 may include a characteristic of reducing the proportion of light components near the wavelength of 160 nm by increasing the proportion of light components on the wavelength side shorter than the wavelength of 160 nm in the light including the VUV light. It may be possible to adopt a configuration in which the characteristics of light emitted from the lamp 44 are changed to characteristics further suitable for achieving improvements in sensitivity and LER (changes the spectrum shape) using such a filter 50 and the light is emitted to the workpiece W. In this case, it is considered that the effect obtained by emitting light including vacuum ultraviolet light (VUV light) can be enhanced.

Although FIG. 19 exemplifies the filter 50 as a light adjustment member, this configuration may be changed. For example, when the housing 21 of the processing chamber 20 is provided with a transmission window 21$x$ for transmitting light L1 from the light source 42, the transmission window 21$x$ may be configured to have a function as a light adjustment member. That is, the transmission window 21$x$ may be constituted with a member made of a material that changes the transmittance of light for each wavelength such that the characteristics of the light passing through the transmission window 21$x$ change in the same manner as in the case in which the light has passed through the filter 50. How the light adjustment member is provided may be changed depending on the configuration and arrangement of the light source 42.

[Actions]

As described above, in the substrate processing apparatus 1 and the substrate processing method, light including vacuum ultraviolet light (VUV light) is emitted to the front surface of a substrate (the workpiece W), which has a resist film formed thereon from a resist material for EUV lithography, before an exposure process within the housing 21 serving as a processing container. By emitting the light including the vacuum ultraviolet light to the front surface of the substrate, which has a resist film formed thereon from a resist material for EUV lithography, for example, cleavage of chemical bonds in the resist film occurs, and as a result, sensitivity when exposing the resist film increases.

In an aspect, the light including the vacuum ultraviolet light may be light including consecutive spectrum components of at least a partial band included in a wavelength range of 100 nm to 200 nm. As described above, by emitting, to the resist film, the light including the consecutive spectrum components of at least a partial band included in the wavelength range of 100 nm to 200 nm, sensitivity when exposing the resist film is increased since chemical bonds in the resist film are cleaved at various places.

In an aspect, the amount of the light including the vacuum ultraviolet light per unit area of the front surface of the substrate may be smaller than the amount of light when the light including the vacuum ultraviolet light is emitted after the exposure process. When the light including the vacuum ultraviolet light is emitted before exposure, the effect of increasing sensitivity for exposure is enhanced since light permeates into the resist film even when the amount of light is smaller.

In an aspect, the light may be emitted in the state in which the temperature of the substrate is substantially equal to, for example, the atmospheric temperature outside the processing container. When the light is emitted in the state in which the temperature of the substrate is substantially equal to the atmospheric temperature, it is possible to prevent a change in the characteristic of the resist film caused due to a change in the temperature of the substrate.

The light including the vacuum ultraviolet light may be emitted in the state in which the interior of the processing container is depressurized. By emitting the light including the vacuum ultraviolet light in the state in which the interior of the processing container is depressurized, the permeation of the light including the vacuum ultraviolet light into the resist film is promoted, and the effect of increasing the sensitivity is enhanced. In addition, the light including the vacuum ultraviolet light may be emitted in the state in which the interior of the processing container is boosted to a predetermined pressure equal to or lower than the atmospheric pressure after depressurized to a predetermined degree of vacuum. With such a configuration, it is possible to suppress degassing (outgassing) from the front surface of the substrate.

As an example, after emission of the light including the vacuum ultraviolet light, an exposure process may be performed without performing a heating process. With the configuration in which the exposure process is performed without performing the heating process, it is possible to prevent the heating process on the substrate from being excessive.

In addition, as another example, the heating process may be performed after emission of the light including the vacuum ultraviolet light and before an exposure process. With the configuration in which the heating process is performed before the exposure process, it is possible to promote the reaction in the resist film on the substrate and to prevent the exposure from becoming insufficient.

The light including the vacuum ultraviolet light emitted from the light sources 42 may be emitted to the front surface of the substrate in the state in which by causing the light to pass through a member, such as a filter 50 as a light adjustment member, the variation in the intensity distribution of light at each wavelength is made to be smaller than that before the transmission. In this case, by causing the light including the vacuum ultraviolet light to pass through the light adjustment member, it is possible to emit the light including the vacuum ultraviolet light to the substrate in the state in which the variation in the intensity distribution of light of each wavelength is made to be smaller than that before the transmission. As a result, since it is possible to emit the light to the resist film in the state in which the proportions of light of various wavelengths are closer to homogeneity, a sensitivity increasing effect when exposing the resist film is enhanced.

In addition, as described as a modification, the front surface of the substrate, to which the light including the vacuum ultraviolet light has been emitted, may be evaluated, and the processing conditions for the substrate may be changed according to the results of evaluation. As described above, by changing the processing conditions for the substrate according to the results of evaluation of the front surface of the substrate, it is possible to select an appropriate condition in response to, for example, a change in the front surface due to the emission of the light including the vacuum ultraviolet light. In addition, as shown in FIG. 14, the substrate to be evaluated may be a substrate after the emission of the light including vacuum ultraviolet light and before heating, or a substrate having a resist pattern formed thereon after an exposure/development process. In the latter case, a change content may be reflected in the processing conditions of the substrate to be processed next.

The substrate processing apparatus 1 may be provided at a position corresponding to a substrate transfer path between a resist film forming module COT and an exposure apparatus S4 within a stacking part in which processing modules are stacked and arranged in the coating and development apparatus 200. With this configuration, it is possible to perform processes by the substrate processing apparatus 1 while transferring a substrate in the order of the processes for the substrate. Therefore, the processes by the substrate processing apparatus 1 can be performed while preventing the work efficiency in the coating and development apparatus 200 from being lowered.

Although various exemplary embodiments have been described above, the present disclosure is not limited to the exemplary embodiments described above, and various omissions, substitutions, and changes may be made. In addition, elements in different embodiments may be combined to form other embodiments.

For example, the arrangement and number of light sources 42 in the substrate processing apparatus 1 may be changed appropriately. In addition, for example, a member for controlling the path of light emitted from the light sources 42 may be added. In addition, the arrangement and configuration of each part within the substrate processing apparatus 1 may be changed appropriately. In addition, the pressure control or the like described in the above-described embodiments is an example, and the pressure control inside the housing 21 may be changed including steps before the light emission from the light sources 42.

According to the present disclosure, it is possible to provide a technique capable of improving sensitivity at the time of exposure in a substrate using a resist material suitable for EUV lithography.

From the foregoing, it should be understood that various embodiments of the present disclosure have been described herein for purposes of illustration, and that various modifications can be made without departing from the scope and spirit of the present disclosure. Accordingly, the various embodiments disclosed herein are not intended to be limiting, and the true scope and spirit of the disclosure is indicated by the appended claims.

What is claimed is:

1. A method of processing a substrate, the method comprising:
  emitting light including vacuum ultraviolet light from a light source to a front surface of the substrate, wherein the substrate has a resist film formed thereon from a resist material for EUV lithography, before an exposure process in an interior of a processing container,
  wherein the light including the vacuum ultraviolet light is emitted to the front surface of the substrate through a light adjustment member disposed between the light source and the front surface of the substrate, and
  wherein an intensity proportion of a first wavelength range constituting an intensity peak of the light after being passed through the light adjustment member is smaller than that of the light before being passed through the light adjustment member, and an intensity proportion of a second wavelength range different from the first wavelength range of the light after being passed through the light adjustment member is larger than that of the light before being passed through the light adjustment member.

2. The method of claim 1, wherein the light including the vacuum ultraviolet light is light including consecutive spectrum components of at least a partial band included in a wavelength range of 100 nm to 200 nm.

3. The method of claim 2, wherein an amount of the light including the vacuum ultraviolet light per unit area of the front surface of the substrate is smaller than an amount of light when emitting the light including the vacuum ultraviolet light after the exposure process.

4. The method of claim 3, wherein the light is emitted in a state in which a temperature of the substrate is substantially equal to an atmospheric temperature.

5. The method of claim 3, wherein the light including the vacuum ultraviolet light is emitted in a state in which the interior of the processing container is depressurized.

6. The method of claim 5, wherein the light including the vacuum ultraviolet light is emitted in a state in which the interior of the processing container is boosted to a predetermined pressure equal to or lower than an atmospheric pressure by supplying an inert gas into the processing container after depressurized to a predetermined degree of vacuum.

7. The method of claim 1, wherein, after emitting the light including the vacuum ultraviolet light, a heating process is performed before the exposure process.

8. The method of claim 1, wherein the front surface of the substrate to which the light including the vacuum ultraviolet light has been emitted is evaluated, and a processing condition for the substrate is changed according to an evaluation result.

9. The method of claim 1, wherein, after emitting the light including the vacuum ultraviolet light, the exposure process is performed without performing a heating process.

10. A non-transitory computer-readable storage medium storing a program, wherein the storage medium is configured to cause an apparatus to emitting a light including vacuum ultraviolet light from a light source to a front surface of a substrate, wherein the substrate has a resist film formed thereon from a resist material for EUV lithography, before an exposure process in an interior of a processing container,
wherein the light including the vacuum ultraviolet light is emitted to the front surface of the substrate through a light adjustment member disposed between the light source and the front surface of the substrate, and
wherein an intensity proportion of a first wavelength range constituting an intensity peak of the light after being passed through the light adjustment member is smaller than that of the light before being passed through the light adjustment member, and an intensity proportion of a second wavelength range different from the first wavelength range of the light after being passed through the light adjustment member is larger than that of the light before being passed through the light adjustment member.

11. A substrate processing apparatus comprising:
a processing container;
a light source configured to emit light including vacuum ultraviolet light to a substrate, which has a resist film formed thereon from a resist material for EUV lithography, in an interior of the processing container;
a controller configured to control the light source to emit the light including the vacuum ultraviolet light before an exposure process for the substrate; and
a light adjustment member disposed between the light source and a front surface of the substrate,
wherein the light including the vacuum ultraviolet light is emitted to the front surface of the substrate through the light adjustment member, and
wherein an intensity proportion of a first wavelength range constituting an intensity peak of the light after being passed through the light adjustment member is smaller than that of the light before being passed through the light adjustment member, and an intensity proportion of a second wavelength range different from the first wavelength range of the light after being passed through the light adjustment member is larger than that of the light before being passed through the light adjustment member.

12. The substrate processing apparatus of claim 11, wherein the light including the vacuum ultraviolet light is light including consecutive spectrum components of at least a partial band included in a wavelength range of 100 nm to 200 nm.

13. The substrate processing apparatus of claim 12, wherein the controller is configured to control the light source such that an amount of the light including the vacuum ultraviolet light per unit area of the front surface of the substrate is smaller than an amount of light when the light including the vacuum ultraviolet light is emitted after the exposure process.

14. The substrate processing apparatus of claim 13, wherein the controller is configured to control the light source to emit the light in a state in which a temperature of the substrate is substantially equal to an atmospheric temperature.

15. The substrate processing apparatus of claim 13, wherein the controller is configured to control the light source to emit the light including the vacuum ultraviolet light in a state in which the interior of the processing container is depressurized.

16. The substrate processing apparatus of claim 13, wherein the light adjustment member is provided on an optical path of the light including the vacuum ultraviolet light emitted from the light source to the substrate, and
wherein the light adjustment member is configured to emit the light including the vacuum ultraviolet light to the front surface of the substrate in a state in which the light including the vacuum ultraviolet light is incident on the light adjustment member.

17. The substrate processing apparatus of claim 16, wherein the substrate processing apparatus is provided at a position corresponding to a transfer path for the substrate between a resist film forming module and an exposure apparatus within a stacking part in which processing modules are stacked and arranged in a coating and development apparatus.

18. The substrate processing apparatus of claim 11, wherein the controller is configured to control the light source such that an amount of the light including the vacuum ultraviolet light per unit area of the front surface of the substrate is smaller than an amount of light when the light including the vacuum ultraviolet light is emitted after the exposure process.

19. The substrate processing apparatus of claim 11, wherein the controller is configured to control the light source to emit the light in a state in which a temperature of the substrate is substantially equal to an atmospheric temperature.

* * * * *